United States Patent
Wolf et al.

(10) Patent No.: US 8,520,307 B2
(45) Date of Patent: Aug. 27, 2013

(54) OPTICAL INTEGRATOR FOR AN ILLUMINATION SYSTEM OF A MICROLITHOGRAPHIC PROJECTION EXPOSURE APPARATUS

(75) Inventors: Oliver Wolf, Aalen (DE); Heiko Siekmann, Aalen (DE); Eva Kalchbrenner, Bopfingen (DE); Siegfried Rennon, Wuerzburg (DE); Johannes Wangler, Koenigsbronn (DE); Andre Bresan, Aalen (DE); Michael Gerhard, Aalen (DE); Nils Haverkamp, Oberkochen (DE); Axel Scholz, Aalen (DE); Ralf Scharnweber, Aalen (DE); Michael Layh, Aalen (DE); Stefan Burkart, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 118 days.

(21) Appl. No.: 12/973,234

(22) Filed: Dec. 20, 2010

(65) Prior Publication Data
US 2011/0083542 A1    Apr. 14, 2011

Related U.S. Application Data

(63) Continuation of application No. 12/186,365, filed on Aug. 5, 2008, now Pat. No. 7,880,969, which is a continuation of application No. PCT/EP2007/001370, filed on Feb. 16, 2007.

(60) Provisional application No. 60/774,850, filed on Feb. 17, 2006, provisional application No. 60/804,369, filed on Jun. 9, 2006.

(51) Int. Cl.
*G02B 27/10*    (2006.01)

(52) U.S. Cl.
USPC ........................................................ 359/621

(58) Field of Classification Search
USPC ........................................................ 359/621
See application file for complete search history.

(56) References Cited

U.S. PATENT DOCUMENTS

| 4,682,885 | A | 7/1987 | Torigoe |
| 5,229,872 | A | 7/1993 | Mumola |
| 5,296,891 | A | 3/1994 | Vogt et al. |
| 5,523,193 | A | 6/1996 | Nelson |

(Continued)

FOREIGN PATENT DOCUMENTS

| EP | 0 468 328 A1 | 1/1992 |
| EP | 0 576 297 A1 | 12/1993 |

(Continued)

OTHER PUBLICATIONS

D. L. Decker et al., "Optical and Surface Physical Characteristics of Diamond-machined Infrared Windows".

(Continued)

*Primary Examiner* — James Jones
(74) *Attorney, Agent, or Firm* — Fish & Richardson P.C.

(57) ABSTRACT

The disclosure relates to an optical integrator configured to produce a plurality of secondary light sources in an illumination system of a microlithographic projection exposure apparatus. The disclosure also relates to a method of manufacturing an array of elongated microlenses for use in such an illumination system. Arrays of elongated microlenses are often contained in optical integrators or scattering plates of such illumination systems.

48 Claims, 19 Drawing Sheets

(56) References Cited

U.S. PATENT DOCUMENTS

| | | | |
|---|---|---|---|
| 5,815,248 | A | 9/1998 | Nishi |
| 5,847,746 | A | 12/1998 | Takahashi |
| 5,963,305 | A | 10/1999 | Mizouchi |
| 6,243,206 | B1 | 6/2001 | Wangler |
| 6,416,237 | B2 | 7/2002 | Lissotschenko et al. |
| 6,583,937 | B1 | 6/2003 | Wangler et al. |
| 6,738,129 | B2 | 5/2004 | Mizouchi |
| 6,816,234 | B2 | 11/2004 | Tsuji |
| 2002/0030890 | A1 | 3/2002 | Kato et al. |
| 2002/0036763 | A1 | 3/2002 | Krikke et al. |
| 2004/0036977 | A1 | 2/2004 | Tanaka et al. |
| 2004/0105170 | A1 | 6/2004 | Krahmer et al. |
| 2004/0169220 | A1* | 9/2004 | Takemori et al. ............ 257/330 |
| 2005/0018294 | A1 | 1/2005 | Hauschild |
| 2005/0041295 | A1* | 2/2005 | Yoshikawa et al. .......... 359/619 |
| 2005/0140860 | A1 | 6/2005 | Olczak |
| 2007/0024836 | A1 | 2/2007 | Singer et al. |
| 2007/0217013 | A1 | 9/2007 | Schuster et al. |
| 2009/0021716 | A1 | 1/2009 | Wangler et al. |

FOREIGN PATENT DOCUMENTS

| | | |
|---|---|---|
| EP | 0 921 418 | 6/1999 |
| EP | 0 952 491 A2 | 10/1999 |
| JP | 6-084759 | 3/1994 |
| JP | 11-183706 | 7/1999 |
| JP | 2002-043221 | 2/2002 |
| JP | 2002-286989 | 10/2002 |
| JP | 2003-090959 | 3/2003 |
| JP | 2004-056103 | 2/2004 |
| JP | 2005-010787 | 1/2005 |
| JP | 2005-331804 | 12/2005 |
| JP | 2006-017957 | 1/2006 |
| WO | WO 02/077692 | 10/2002 |
| WO | WO 03/026846 | 4/2003 |
| WO | WO 2005/076083 | 8/2005 |
| WO | WO 2005/078522 | 8/2005 |
| WO | WO 2007/093396 | 8/2007 |
| WO | WO 2007/093433 | 8/2007 |

OTHER PUBLICATIONS

"The Science of Ceramic Machining and Surface Finishing II," B. J. Hockey and R. W. Rice, Editors, National Bureau of Standards Special Publications (U.S. Government Printing Office, Washington D. C., 1979), pp. 293 to 304.

J. B. Arnold et al., "Machinability Studies of Infrared Window Materials and Metals," SPIE vol. 93, Advances in Precision Machining of Optics (1976), pp. 96-103.

D. Flamm et al., "Fabrication of Microlens Arrays in CaF2 by Ion Milling," Micromachining Technologies for Micro Optics, Proceeding SPIE vol. 4179 (2000).

F. Z. Fang et al., "Burr Formation and Fly-cutting," www.simtech.a-star.edu.sg/research/technicalreports/tr0311.pdf on Jan. 29, 2007.

Japanese Office Action, with English translation, for corresponding JP Appl No. 2008-554689, dated Nov. 7, 2011.

F Z Fang and Y C Liu, "On minimum exit-burr in micro cutting," J. Micromech. Microeng., 14:984-988, 2004.

* cited by examiner

OPTICAL INTEGRATOR FOR AN ILLUMINATION SYSTEM OF A MICROLITHOGRAPHIC PROJECTION EXPOSURE APPARATUS

CROSS-REFERENCE TO RELATED APPLICATIONS

This application is a continuation of U.S. application Ser. No. 12/186,365, filed Aug. 5, 2008, which is a continuation of international patent application serial number PCT/EP2007/001370, filed Feb. 16, 2007, which claims benefit of U.S. provisional patent application Ser. No. 60/774,850 filed Feb. 17, 2006 and U.S. provisional patent application Ser. No. 60/804,369, filed Jun. 9, 2006. The full disclosure of these applications is incorporated herein by reference.

FIELD

The disclosure relates to an optical integrator configured to produce a plurality of secondary light sources in an illumination system of a microlithographic projection exposure apparatus. The disclosure also relates to a method of manufacturing an array of elongated microlenses for use in such an illumination system. Arrays of elongated microlenses are often contained in optical integrators or scattering plates of such illumination systems.

BACKGROUND

Microlithography (also called photolithography or simply lithography) is a technology for the fabrication of integrated circuits, liquid crystal displays and other micro-structured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask stage for a aligning the mask, a projection lens and a wafer alignment stage for aligning the wafer coated with the photoresist. The illumination system illuminates a field on the mask that often has the shape of an (elongated) rectangle or a ring segment.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification of the projection lens, which is usually smaller than 1, for example 1:4.

SUMMARY

In some embodiments, the disclosure provides an optical integrator for producing a plurality of secondary light sources in an illumination system of a microlithographic projection exposure apparatus. The optical integrator can make it possible to achieve a desired irradiance and angular far field distribution in a mask plane. More particularly, a uniform or desired nonuniform irradiance distribution can be achieved in which undesired ripples are reduced.

In certain embodiments, the disclosure provides a method for manufacturing very accurately an array of elongated microlenses for use in an illumination system in a microlithographic projection exposure apparatus.

In some embodiments, an optical integrator includes a first array of elongated convexly curved first microlenses that are arranged side by side in a first plane and have first vertex lines. The optical integrator further includes a second array of elongated convexly curved second microlenses that are arranged side by side in a second plane and have second vertex lines. At least one second vertex line or a portion thereof does not coincide, in a projection along an optical axis of the optical integrator, with anyone of the first vertex lines or portions thereof.

It has been discovered that by laterally displacing corresponding microlenses it is possible to laterally shift also the intensity distribution in the far field. If the vertex lines of a plurality of corresponding microlenses do not coincide in a projection along the optical axis, the laterally displaced intensity distributions in the far field superimpose to a total intensity distribution in which ripples present in each intensity distribution produced by a single microlens are reduced as a result of an averaging effect.

There are various approaches how a complete coincidence of the vertex lines of all or some pairs of corresponding microlenses can be avoided. For example, the at least one second vertex line may form a zigzag or a serpentine line. In the case of a zigzag line adjacent straight portions of the at least one second vertex line may be inclined by a common angle δ with respect to a reference direction. This ensures that the distances by which the intensity distributions in the far field are laterally displaced follow an equipartition function which ensures the best averaging effect.

As a matter of course, the vertex lines of both the first and the second microlenses may form zigzag or serpentine lines, or only portions within the first and/or second microlenses may have vertex lines that do not coincide with the vertex line of the corresponding microlens in the other array. It should be noted that the light may propagate through the optical integrator either along a direction from the first to the second microlenses or along the opposite direction.

Instead of or in addition to the introduction of an inclination angle between the vertex lines of corresponding microlenses it may also be envisaged to provide second microlenses having varying pitches. A complete coincidence between corresponding vertex lines is then avoided even if both the first and the second vertex lines are straight.

In certain embodiments, an optical integrator includes a first array of elongated first microlenses that are arranged side by side in a first plane. The optical integrator further includes a second array of elongated second microlenses that are arranged side by side in a second plane. At least one second microlens has a curved surface profile which varies along a longitudinal axis of the at least one second microlens.

Such a variation of the curved surface profile of microlenses makes it possible to change the angular distribution produced by the microlenses in certain areas distributed over an exit surface of the optical integrator. For example, it is possible to introduce a field dependent variation of the telecentricity and ellipticity properties of the projection light impinging on the mask plane.

A local change of the curved surface profile may also be advantageous to reduce ripples in the far field intensity distribution, because different curved surface profiles produce different far field intensity distributions that result, if superimposed in a mask plane, in a smoother overall intensity distribution. In this case it may be desired to restrict the surface profile variation to individual microlenses.

For modifying the telecentricity and ellipticity properties in the far field, it is usually desired to provide a plurality of adjacent second microlenses that have curved surface profiles which vary along longitudinal axes of the plurality of second microlenses. For example, a second array of second microlenses may include at least one first area in which the second microlenses have first curved surface profiles. In at least one second area the second microlenses have second curved surface profiles that differ from the first curved surface profiles in that material has been locally removed. If material is removed only in the at least one second area, for example by polishing or ion beam etching, the curved surface profiles are locally modified which results in a field dependent change of the telecentricity and ellipticity properties of the illumination system. Before the material is removed, the second curved surface profiles may all be identical or may differ from each other, for example with respect to the radius of curvature or the microlens pitch.

For modifying the telecentricity and ellipticity properties of the illumination system, at least two second areas may be arranged along a first direction, and at least two further second areas may be arranged along a second direction which is at least substantially perpendicular to the first direction. The second microlenses in the second areas arranged along the first direction then have curved surface profiles that are different from the curved surface profiles of the second microlenses in the further second areas arranged along the second direction.

In some embodiments, the disclosure provides a method that includes providing a substrate and a cutting tool including a cutting edge. The cutting tool is repeatedly moved relative to the substrate in a fly-cut process, thereby enabling the cutting edge to cut into the substrate. During this step the substrate is moved along a longitudinal direction which is parallel to the longitudinal axes of the microlenses. The substrate is then moved at least substantially perpendicular to the longitudinal direction. Then the steps of moving the cutting tool and simultaneously moving the substrate are repeated until all microlenses are formed on the substrate.

In principle, it is possible to form microlens arrays also on curved surfaces. However, it will usually be desired to move the substrate parallel to a machining plane. If the substrate is moved during the fly-cut process along straight parallel lines, cylindrical microlenses are formed which are all arranged in parallel. If the substrate is moved along zigzag or serpentine lines, the longitudinal axes of the microlenses will also have the shape of zigzag or serpentine lines.

During the fly-cut process the cutting tool is optionally rotated around a rotational axis. This rotational axis may extend at least substantially parallel to a substrate surface on which the microlenses are to be formed. In a fly-cut process the cutting edge points away from the rotational axis and may be spaced apart from the rotational axis by at least 5 mm, such as by more than 9 mm and less than 11 mm. With such distances the rotational frequency of the cutting tool may be in excess of 5000 1/ min, such as between 8000 1/ min and 10000 1/ min.

If the substrate is, between the formation of single microlenses, laterally moved substantially by a multiple of the pitch of the microlenses, an interleaved microlens manufacturing sequence may be obtained. This may be advantageous because the cutting edge is usually subject to wear, and consequently the microlenses formed during the fly-cut process will have slight variations of their surface profile. By the application of an interleaved manufacturing sequence, the variations are distributed over the entire surface of the substrate, which has a positive effect on the uniformity of the far field intensity distribution.

For changing a surface profile of at least one microlens, at least a portion of the surface of this microlens may be reworked. This may be accomplished, for example, by repeating the fly-cut process with a cutting tool having a different cutting edge. A cutting edge having different cutting properties may be obtained by simply turning one and the same cutting tool by 180°.

The surface may reworked also by polishing the at least one microlens, or by exposing the at least one microlens or at least a portion thereof to an ion beam. The ion beam should have a cross section with a maximum dimension which is greater than a pitch of the at least one microlens. A plurality of microlenses is then exposed to the same flow of ions impinging in parallel on the surface of the microlens. Since the angle formed between the ion beam direction and the surface strongly varies in cross sections perpendicular to the longitudinal directions of the microlenses, the etch rate also strongly varies within the cross sections. This makes it possible to modify the curved surface profiles of the microlenses with a homogenous ion beam, without the need to direct a very thin ion beam on a portion of a single microlens, and to vary the etch rate by controlling the etch time. For influencing the etch rate, the orientation between the at least one microlens or a portion thereof and the ion beam may be changed, for example by using a tilt table on which the substrate with the microlens array is attached.

Alternatively or additionally, a coating consisting of a carefully selected material, or including layers of different materials, may be deposited on the microlenses. The material of the coating then provides an additional degree of design freedom that may be exploited when the process parameters are determined that are used for obtaining the desired surface manipulation. If the material is an anisotropic crystal such as $CaF_2$, the etch rate R also depends on the crystal orientation.

BRIEF DESCRIPTION OF THE DRAWINGS

Various features and advantages of the present disclosure may be more readily understood with reference to the following detailed description taken in conjunction with the accompanying drawing in which.

DETAILED DESCRIPTION

1. Optical Integrator

In the following the general structure and function of an optical integrator in accordance with the present invention will be explained.

1.1 General Structure

Figure 1:
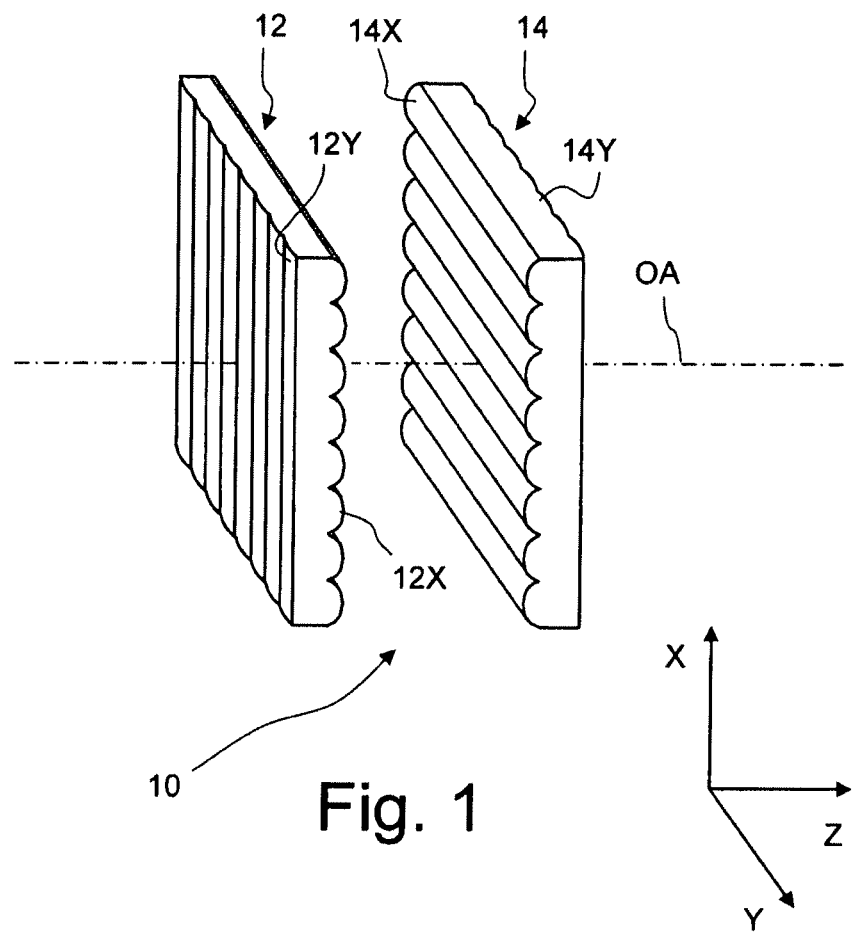
FIG. 1 shows a perspective view of an optical integrator.

FIG. 1 is a simplified and perspective view of an optical integrator which is denoted in its entirety by 10. The optical integrator 10 of this embodiment is made up of a first integrator member 12 and a second integrator member 14. The first integrator member 12 includes a first array of cylindrical microlenses 12Y having parallel longitudinal axes that are aligned along an X direction. The first integrator member 12 further includes an array of second cylindrical microlenses 12X that have parallel longitudinal axes aligned along a Y direction which is perpendicular to the X direction. Since the longitudinal axes of the microlenses 12Y, 12X are straight, the first microlenses 12Y have a refractive power only along the Y direction, and the second microlenses 12X have a refractive power only in the X direction.

The second integrator member 14 is an identical copy of the first integrator member 14, but is mounted after rotation by 180° around either the X or the Y axis. Thus third microlenses 14X are facing the second microlenses 12X, and fourth microlenses 14Y are facing away from the first integrator member 12.

In the embodiment shown the focal lengths of the microlenses 12X, 12Y, 14X, 14Y and the distance between the integrator members 12, 14 along the optical axis OA are selected such that focal lines produced by the second microlenses 12X are located on the vertices of the third microlenses 14X. Since the third microlenses 14X have the same focal length as the second microlenses 12X, this implies that the focal lines of the third microlenses 14X are located on the vertices of the second microlenses 12X. The same conditions also apply, mutatis mutandis, to the first and fourth microlenses 12Y and 14Y, respectively.

In an alternative embodiment (not shown), the second and third microlenses 12X and 14X, respectively, are different. More particularly, the focal length of the second microlenses 12X is greater than the focal length of the third microlenses 14X. The distance between the integrator members 12, 14 may then be selected such that the focal lines of the third microlenses 14 are still on or in close proximity to the vertices of the second microlenses 12X. The focal lines of the second microlenses 12X are within the fourth microlenses 14Y or even further away, i.e. outside the second integrator member 14.

Each microlens 12Y, 12X, 14X, 14Y is geometrically defined by its longitudinal axis, its pitch, i.e. the width perpendicular to its longitudinal axis, and the curved surface profile of the refractive surface. The term "profile" relates to the shape of the surface in (any) cross section perpendicular to the longitudinal axis of the microlens.

The surface profile mainly determines the optical properties of the microlenses. For example, if the second microlenses 12X have curved surface profiles which are circular, the second microlenses 12X have in a XZ plane the effect of spherical lenses. If the curved surface profiles are not circular, the second microlenses 12X have in this plane the effect of aspherical lenses.

The pitches of the microlenses 12Y, 12X, 14X, 14Y should be below 5 mm or better below 2 mm. In the embodiment shown the pitches are in a range between several micrometers up to several hundred micrometers, for example 500 μm. Usually it is desired to have pitches that are greater, for example by a factor 3, than the wavelength of the light which propagates through the optical integrator 10.

Various other alternative structures of optical integrators are described in International Patent Application No. PCT/EP2007/001267, which claims priority to the same U.S. provisional application 60/774,850 filed Feb. 17, 2006 as is claimed by the present application. For example, the first, second, third and fourth microlenses 12Y, 12X, 14X, 14Y may be distributed to more than two integrator members, and also the sequence of the microlenses may be changed.

1.2 Function

The optical integrator 10 is intended for producing a plurality of secondary light sources in an illumination system of a microlithographic projection exposure apparatus. Each secondary light source completely illuminates the illuminated field on the mask. This will be explained with reference to FIG. 2; a more detailed explanation of the function can be found in the aforementioned International Patent Application No. PCT/EP2007/001267.

Figure 2:
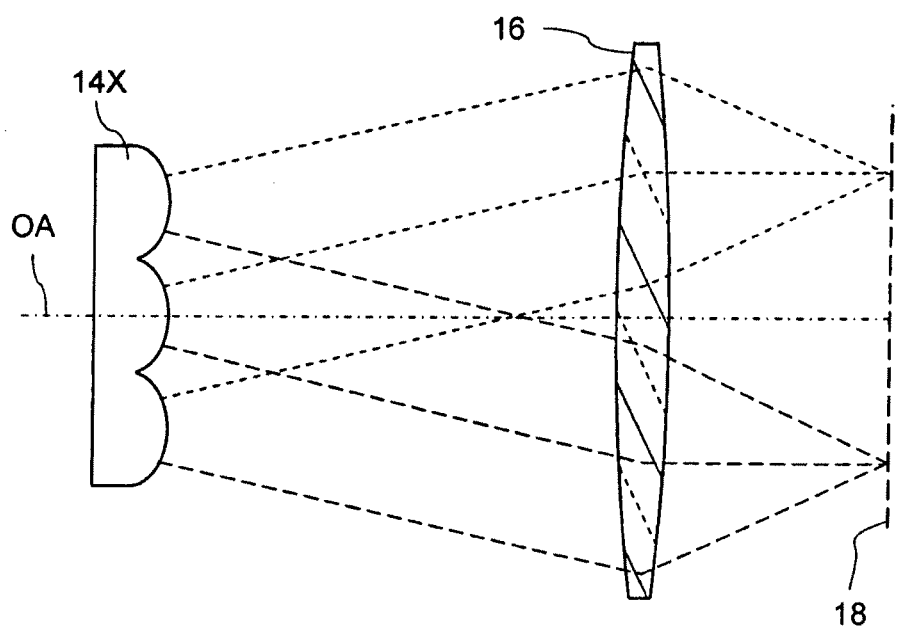
FIG. 2 is a schematic meridional section of some microlenses of the optical integrator, a condenser lens and a mask plane of an illumination system of a microlithographic projection exposure apparatus.

FIG. 2 shows three third microlenses 14X, a condenser lens 16 of an illumination system and a mask plane 18 (or an intermediate field plane) which is to be illuminated by the optical integrator 10. Each microlens 14X is illuminated by a corresponding second microlens 12X and produces a divergent light bundle. The angular intensity distribution of the light bundles is determined by the curved surface profile of the microlenses 14X. The condenser lens 16 transforms the angular distribution into an intensity distribution in the mask plane 18.

In projection exposure apparatus of the scanning type, the illuminated field on the mask has usually large dimensions along an X direction and much smaller dimensions along a Y direction. This has also implications for the refractive power of the microlenses 12Y, 12X, 14X and 14Y. The first microlenses 12Y and the fourth microlenses 14Y require only a small refractive power because the illuminated field has a small dimension along the Y direction. The second microlenses 12X and in particular the third microlenses 14X desirably have a larger refractive power because they have to produce light bundles having a larger maximum divergence angle.

Ideally the angular distribution is perfectly smooth, and each microlens 14X illuminates the mask plane 18 with a perfectly homogeneous or uniform intensity distribution. If the surface profile of the microlenses does not correspond to its ideal shape, for example as a result of a significant surface roughness, the angular distribution will not be perfectly smooth, and consequently ripples will be observed in the mask plane 18. Since the intensity distributions produced by all microlenses 14X are superposed in the mask plane 18, the ripples may be smoothed as a result of the averaging effect which is associated with the superposition of a large number of intensity distributions. This requires, however, that the intensity distributions produced by each microlens 14X are not perfectly identical. Usually the manufacturing process of the microlenses 14X ensures that there are certain variations between the microlenses. However, these variations may not be sufficient.

The optical integrator 10 is characterized by the introduction of designed, i.e. deliberately introduced, variations. Namely, the third microlenses 14X or different portions within the third microlenses differ from one another with respect to the pitch and/or the longitudinal axis and/or the curved surface profile. This will be explained in more detail further below under section 3.3.

2. Manufacture of Optical Integrator

In the following a method of manufacturing the optical integrator 10 will be explained with reference to FIGS. 3 to 16. The method can involve a fly-cut process that is carried out on a fly-cut machine.

2.1 General Outline of Fly-Cut Machine

Figure 3:
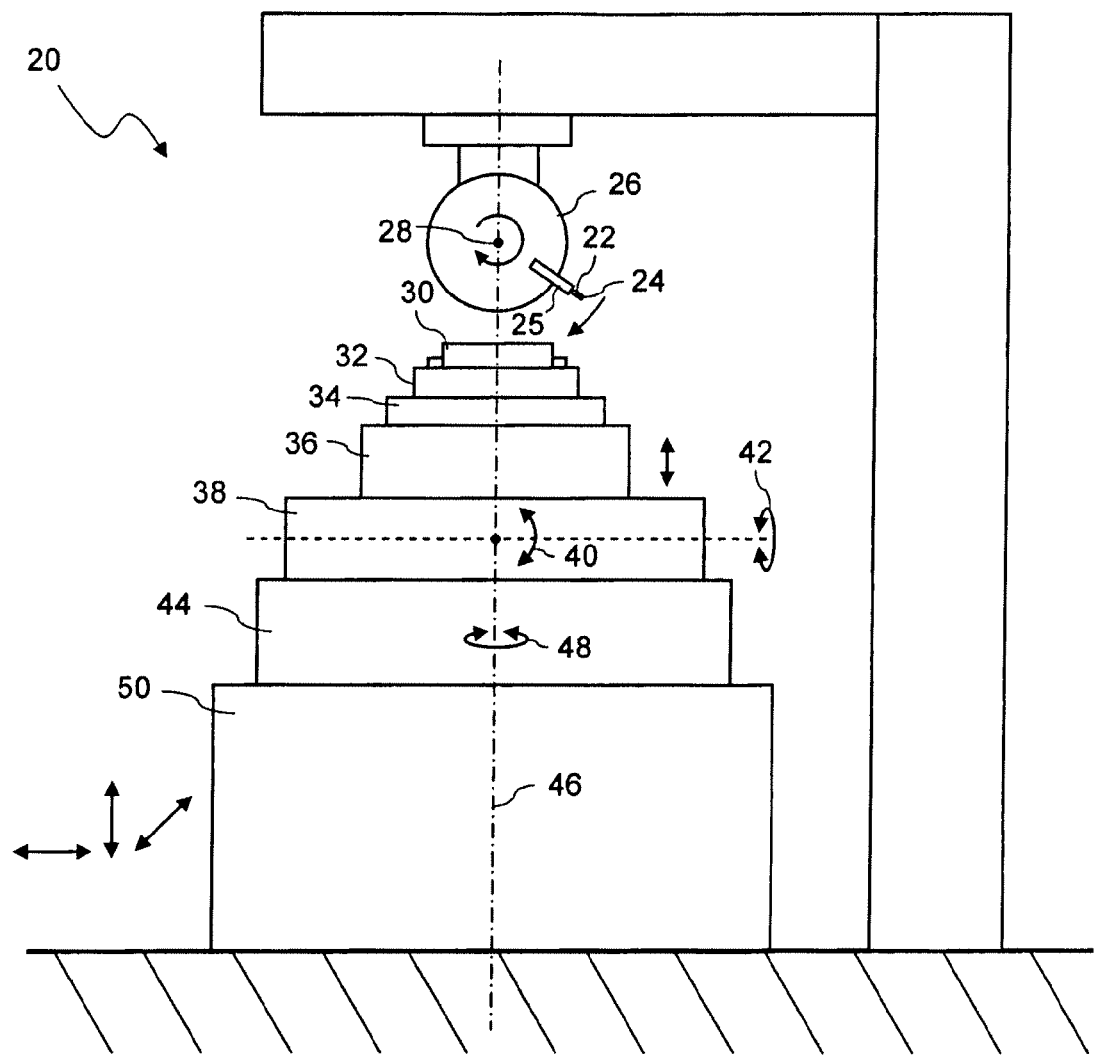
FIG. 3 is a schematic side view of a machine for manufacturing the optical integrator shown in FIG. 1 using a fly-cut process.

FIG. 3 is a schematic side view of a fly-cut machine which is denoted in its entirety by 20. For the sake of clarity the illustration of FIG. 3 is not to scale.

The machine 20 is used to produce the microlenses 12Y, 12X, 14X, 14Y on a suitable substrate by way of a fly-cut process. A fly-cut process differs from a conventional turning process, in which a workpiece is rotated relative to a slowly moving tool, in that the workpiece is slowly moving and the tool is rotated or quickly moved in another way.

For realizing a fly-cut process the fly-cut machine 20 includes a cutting tool 22 with a cutting edge 24. The cutting tool 22 is attached to a holder 25, which is, in the embodiment shown, adjustably mounted to a spindle 26 which is rotated around a rotational axis 28. In general, the cutting edge 24 is spaced apart from the rotational axis 28 by at least 5 mm, such as by more than 9 mm and less than 11 mm. With a typical rotational frequency in excess of 5000 1/ min (e.g., between 8000 1/ min and 10000 1/ min), the cutting edge 24 is moved with a very high velocity relative to a substrate denoted by 30. This makes it possible to produce very smooth and accurate surface profiles on a slowly moving substrate 30.

The substrate to be machined is received in a workpiece holder 32 which is attached via an adaptor member 34 to a lift table 36. The lift table 36 enables the substrate 30 to be adjusted relative to the cutting edge 24 along a Z direction which usually coincides with the vertical direction.

The lift table 36 is mounted to a tilt table 38 which makes it possible to tilt the substrate 30 around two orthogonal X and Y directions, as is indicated in FIG. 3 by arrows 40 and 42. The tilt table 38 is mounted on a turn table 44 that makes it possible to rotate the substrate 30 around a rotational axis 46 (see double arrow 48), which can intersect the rotational axis 28 of the spindle 26. The turn table 44 is mounted on a positioning table 50 that makes it possible to displace the substrate 30 along orthogonal X and Y directions in a plane perpendicular to the Z direction. The positioning table 50 may have a positioning accuracy of 10 nm or even better relative to the spindle 26 and thus relative to the rotating cutting edge 24.

The superposition of the various movements produced by the lift table 36, the tilt table 38, the turn table 44 and the positioning table 50 makes it possible to produce virtually any arbitrary movement of the substrate relative to the fast rotating cutting edge 24. This, in turn, makes it possible to produce a wide variety of structures on a substrate that even may have irregular shapes.

Figure 4:
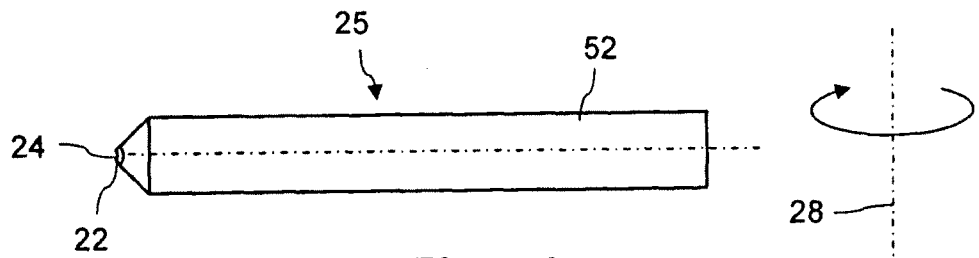
FIG. 4 is a side view of a holder for a tool used for the fly-cut process.

FIG. 4 is a schematic side view of the holder 25 including a shaft 52 to which the cutting tool 22 is attached, for example by soldering. The shaft 52 can be precisely adjustable with respect to the spindle 26 in order to achieve a correct orientation of the tool 22 with respect to the rotational axis 28 of the spindle 26. Alternatively or additionally, an adjustment mechanism may be provided between the tool 22 and the shaft 52.

Figure 5:
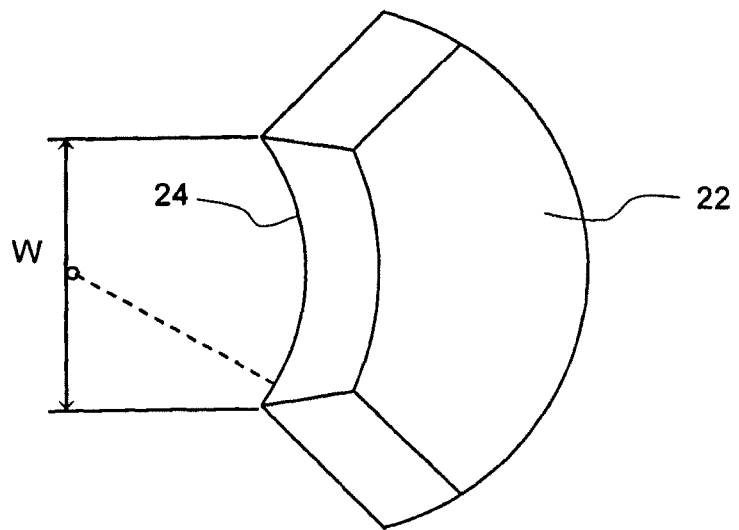
FIG. 5 is a perspective view of the tool.
Figure 6:
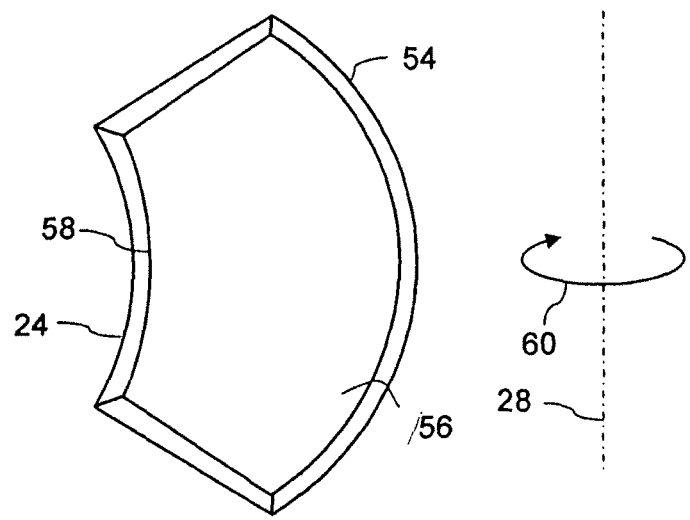
FIG. 6 is a top view of the tool.

FIGS. 5 and 6 show the tool 22 in a perspective view and a top view, respectively. The tool 22 is basically crescent-shaped, with the cutting edge 24 being formed on the inner side of the crescent.

As becomes clear from the top view of FIG. 6, the tool 22 has a larger front surface 54 on which the cutting edge 24 is formed, and a smaller back surface 56 so that the tool 22 recedes behind the cutting edge 24. The curvature of the cutting edge 24, which determines the surface profile of the microlenses to be produced, is smaller than the curvature of the adjacent curved edge 58 of the back surface 56. During the fly-cut process, the rotational direction of the spindle 26 (see arrow 50) is selected such that the front surface 54 with the cutting edge 24 moves towards the substrate, and the cutting edge 24 is first to cut into the surface of the substrate. The adjacent curved edge 58 usually does not come into contact with the substrate during the fly-cut process.

In the embodiment shown the cutting edge 24 defines a concave arch of a circle. With such a cutting edge 24 cylindrical convexly curved microlenses can be manufactured in a fly-cut process that have, in a plane perpendicular to the longitudinal axes of the microlenses, the effect of spherical lenses. The width W between the ends of the cutting edge 24 defines the maximum pitch of the microlenses that may be produced with the tool 22. In the embodiment shown the width W equals 1.500 mm, with an accuracy of 0.001 mm.

The tool 22 is can be made of a monocrystalline diamond. Depending on the material of the substrate, other materials, such as conventional diamonds, a hard metal or ceramics, may be envisaged as well.

2.2 Manufacturing Process

In the following the fly-cut process using the fly-cut machine 20 will be briefly described.

First the substrate, which can have the shape of a plane-parallel plate, is mounted to the workpiece holder 32 and adjusted using the tilt table 38 such that its upper surface pointing towards the spindle 26 is exactly perpendicular to the Z direction. The lift table 36 is used to displace the substrate 30 along the Z direction such that the cutting edge 24 cuts completely into the surface of the substrate 30. During rotation of the spindle 26 the substrate 30 is slowly moved, with the help of the positioning table 50, along a first direction which defines the longitudinal axes of the microlenses to be manufactured. This fly-cut process produces, with a tool as shown in FIGS. 5 and 6, a first convexly shaped cylindrical microlens having a straight longitudinal axis.

If the desired length of the microlenses is achieved, the lift table 36 lowers the substrate 30, and the positioning table 50 displaces the substrate 30 in a transverse direction before the lift table 36 lifts the substrate 30 again. By moving the substrate 30 slowly again, but now opposite to the first direction, a second microlens is produced which extends parallel to the first microlens that has been produced before. If a more homogeneous surface of the microlenses is desired, movements of the substrate 30 during the fly-cut process may not only be parallel, but also be pointed towards the same direction. This is because it may make a difference to cut the cutting edge 24 in a substrate 30 that moves in a same direction as the cutting edge 24 or in an opposite direction.

This process is repeated until the desired number of parallel microlenses is produced on the substrate 30. If microlenses shall also be manufactured on the opposite side of the substrate 30, as is the case with the optical integrator members 12 and 14, the substrate is then released from the workpiece holder 32, reversed and fixed in this reversed orientation in the workpiece holder 32. The process is then repeated. For producing two orthogonal arrays of microlenses on opposite sides of the substrate 30, the slow movements of the substrate during the fly-cut process on both sides are orthogonal.

Instead of moving the substrate 30 along the Z axis with the help of the lift table 36, the spindle 26 may be connected to a modulating unit that makes it possible to move the spindle 26, and thus the cutting edge 24, along the Z direction by small, but very precisely controllable distances.

2.3 General Properties of the Fly-Cut Process

Since the fly-cut process does not involve an etch step, as is the case with some of the conventional methods of producing microlenses, also microlenses made of $CaF_2$ can be manufactured. This is a significant advantage because $CaF_2$ is a very important optical material for optical integrators used at wavelengths below 200 nm.

The fly-cut process also makes it possible to produce microlenses having an excellent edge sharpness. This is particularly important with microlens arrays in which the adjacent microlenses are in immediate contact. As can be seen in the enlarged cutout of FIG. 12, adjacent microlenses abut along straight edges 62 where the curvature is, in the ideal case, zero. However, due to the good edge sharpness that may be achieved with the fly-cut process, it is possible to approximate the ideal shape along the edges 62 to a very good extent. Accordingly, array areas which are optically not usable or that re-fract light to undesired directions can be kept very small.

Figure 12:
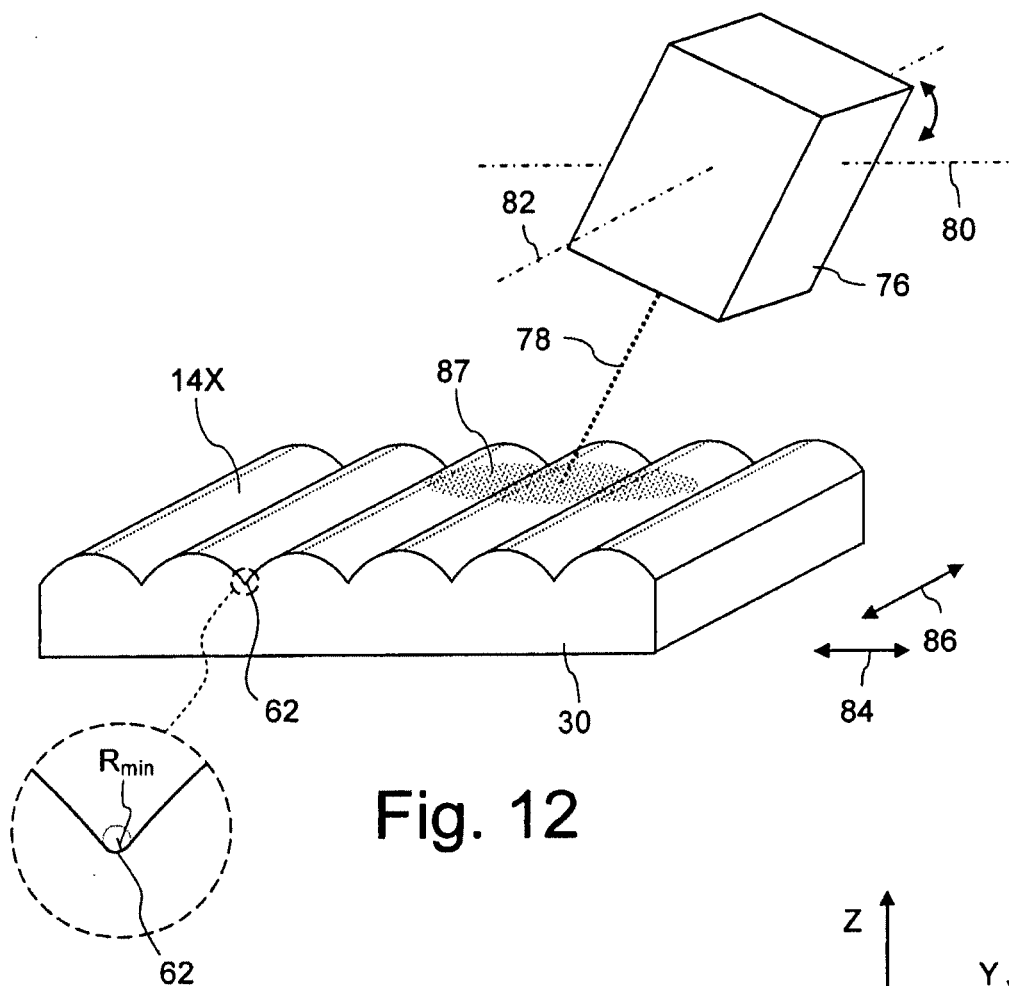
FIG. 12 is a perspective schematic illustration of a general setup for ion beam edging of microlenses.

The edge sharpness may be defined by a minimum radius that can be achieved with the process. In FIG. 12 this radius is indicated by $R_{ra}$m Experiments have shown that an edge radius $R_{min}$ of less than 200 nm can be achieved with the fly-cut process on substrates made of $CaF_2$.

As a result of the high relative velocity between the cutting edge 24 and the substrate 30 a very smooth surface of the microlenses is achieved. Nevertheless this surface is often not perfectly smooth, but displays a micro-roughness. This micro-roughness may depend on the material properties of the substrate 30 and also on the quality and wear conditions of the tool 22. For example, crystal imperfections of a $CaF_2$ substrate may result in material disruptions of some micrometers in diameter and some nanometers in depth.

In order to reduce such a micro-roughness or local disruptions, the surface manufactured with the fly-cut machine 20 may be polished in an additional polishing step. Various polishing methods are suitable for this purpose, for example methods that involve the use of a polishing cloth or a polishing suspension. It is also envisaged to carry out the polishing step with the help of a robot or by applying magnetorheologig fluids or fluid jets. Alternatively or additionally, polishing may be achieved with a rotating polishing cylinder having a profile on its outside which is a negative of the surface profile of the array. Such a polishing cylinder may be mounted to the spindle 26 of the fly-cut machine 20. This has the advantage that imperfections with regard to the surface shape of the microlenses caused by the polishing step are minimized.

It is also possible with the fly-cut process to form microlenses on substrates that are coated. For example, a $CaF_2$ may be coated with a softer material like a resist, another varnish or a metal such as Al or Ni. The microlenses are cut directly either into the coating only or both into the coating and the substrate material. The machined surface is then etched in an etch step in order to remove the remaining coating, such as with a constant removing rate.

The fly-cut process has the additional advantage that all microlenses formed with the same tool are substantially identical. This holds true at least for cases in which material wear of the cutting edge 24 can be neglected during the manufacturing process of a single microlens array. Although the cutting edge 24 may slightly deviate from the ideal shape, all microlenses will nevertheless have the same (non-ideal) shape. In many cases this is advantageous because it results in a systematic error of the intensity distribution obtained in the mask plane.

Such systematic errors can usually be corrected more easily than uncorrelated errors which are typically for microlens arrays produced with other manufacturing technologies.

On the other hand, since the microlenses are manufactured individually (or in small groups, as will be explained further below), the fly-cut process makes it possible to selectively introduce geometric deviations among the microlenses of a single microlens array or even within a single microlens. By carefully designing these deviations it is possible to achieve an averaging effect that results in a smoother intensity distribution in the mask plane. This will be explained in more detail further below in section 3.

The fly-cut process is suitable to manufacture all kinds of elongated microlenses, for example microlenses used in optical integrators or in scattering plates. In principle it may also be envisaged to use the fly-cut process to produce arrays of toric microlenses by cutting two orthogonal sets of cylindrical microlenses on the same side of a substrate.

In the following certain improvements of the fly-cut process are described in more detail.

2.4 Substrate Orientation

Surface micro-roughness causes scattering and requires increased expenditures for polishing the surface. Scattering light generally results in a degradation of the system performance.

In unisotropic optical materials, for example $CaF_2$, the surface roughness also depends on the direction along which the cutting edge cuts into the substrate. This cutting direction has to be distinguished from the direction along which the substrate is slowly moved during the fly-cut process.

In the case of $CaF_2$ the crystal axes are often oriented with respect to the optical axis such that a $\{111\}$ crystal plane is arranged perpendicular to the optical axis. Here the expression $\{111\}$ denotes a set of equivalent crystal planes using the Miller indices formalism. In cubic crystals such as $CaF_2$ each $\{111\}$ plane is perpendicular to one of the equivalent crystal directions (111). The round brackets in (111) denote the set of all equivalent crystal directions <111>, <-1-1-1>, <-1-11>, <1-1-1>, <11-1>, <-111>, <1-11> and <11-1>. For details with regard to Miller indices, crystal directions and crystal planes reference is made to US 2004/0105170 A1 assigned to the applicant.

If a $CaF_2$ crystal is oriented such that a $\{111\}$ crystal plane is oriented perpendicularly to the optical surface, i.e. parallel to a machining surface of a substrate on which the microlenses are to be formed, the crystal displays a three-fold symmetry with respect to the cutting directions for which optimum results in terms of surface roughness are achieved.

Figure 7:
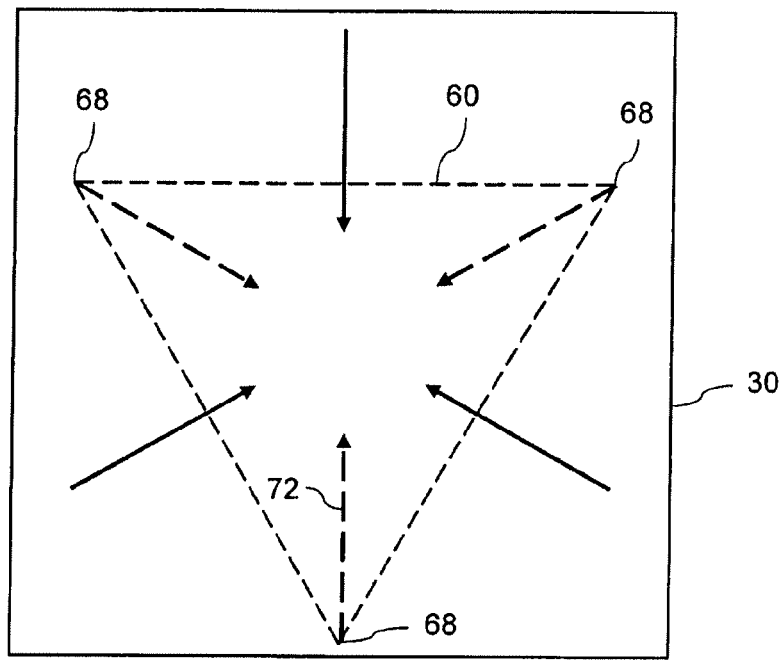
FIG. 7 is a top view on a (111) CaF2 substrate.

FIG. 7 shows a top view on a substrate 30 with a machining surface parallel to a $\{111\}$ crystal plane. Broken lines 60 indicate the intersection of the three equivalent $\{100\}$ crystal planes with the $\{111\}$ crystal plane which is parallel to the machining surface of the substrate 30. The broken lines 66 form a triangle with corners 68. Arrows 70 indicate ideal cutting directions that are perpendicular to the three $\{100\}$ crystal planes. Surprisingly the ideal cutting directions are not mere orientations, but are directions in the sense that optimum results may only be obtained if the cutting edge 24 cuts into the substrate along the direction of the arrows 70. With any of the opposite cutting directions, which are indicated by FIG. 7 by broken line arrows 72, the machined surface will become significantly rougher.

If microlenses are to be manufactured only on one side on a $\{111\}$ $CaF_2$ crystal, the crystalline substrate 30 has simply to be oriented with respect to the rotating cutting edge 24 such that the cutting edge cuts into the substrate 30 along any of the three ideal cutting directions indicated by arrows 70. The turn table 44 may be used for rotating the substrate 30 until the ideal angular position is reached.

If two orthogonal arrays of microlenses shall be fabricated on opposite sides of a $\{111\}$ $CaF_2$ crystal, as it is the case with the integrator members 12 and 14, it is not possible to manufacture both arrays with the ideal cutting direction. In this situation it is possible to make a compromise in which both actual cutting directions are as close as possible to an ideal cutting direction.

Figures 8, 9:
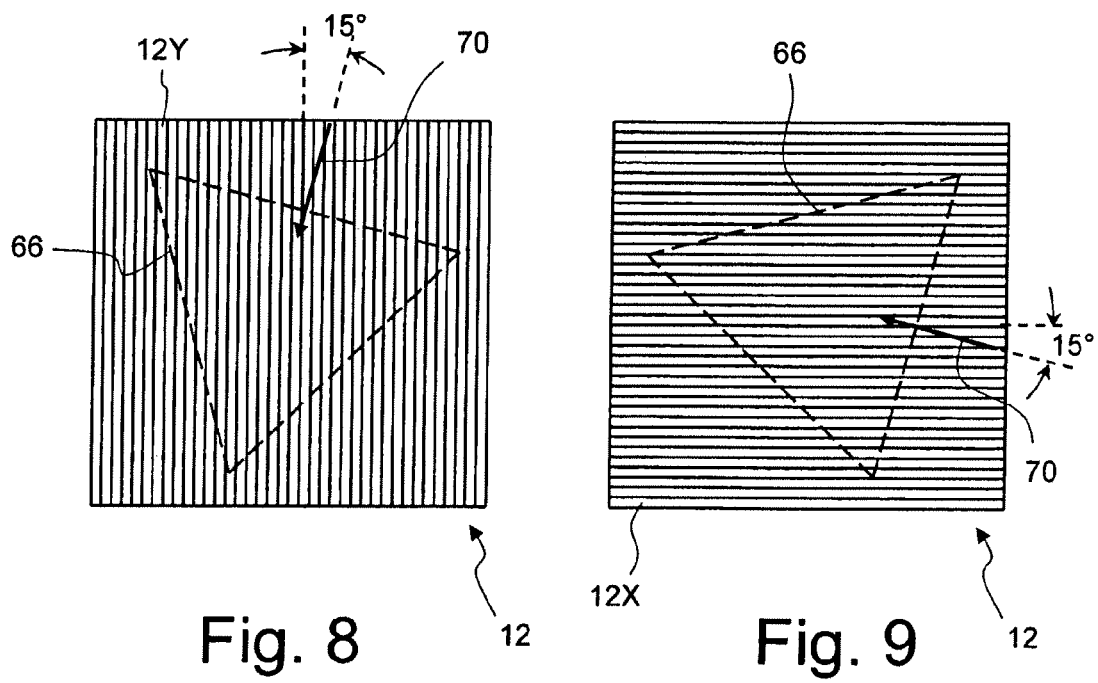
FIGS. 8 and 9 show the crystal orientation of the substrate shown in FIG. 7 for microlens arrays on opposite sides of a substrate.

This situation is shown in FIGS. 8 and 9 which show top views on a top surface and a back surface of the integrator member 12, respectively. The actual cutting directions on both sides correspond to the longitudinal axes along the microlenses 12Y, 12X extend. As is indicated in FIGS. 8 and 9, it is possible to obtain a deviation by 15° between the actual cutting direction and the ideal cutting directions 70 for both surfaces. Since deviations between an ideal cutting direction and an actual cutting direction up to 20° are usually tolerable, the microlenses 12Y and 12X can still be produced with a small surface roughness although none of the microlenses has been fabricated with the ideal cutting direction.

In projection exposure apparatus of the scanning type, the illuminated field on the mask has usually large dimensions along an X direction and much smaller dimensions along a Y direction. This has also implications for the refractive power of the microlenses 12Y, 12X, 14X and 14Y. The first microlenses 12Y and the fourth microlenses 14Y require only a small refractive power because the illuminated field has a small dimension along the Y direction. The second microlenses 12X and in particular the third microlenses 14X desirably have a larger refractive power because they have to produce light bundles having a larger maximum divergence angle.

As has been mentioned above, the second microlenses 12X and the third microlenses 14X have a larger refractive power than the first microlenses 12Y and the fourth microlenses 14Y. This results in an increased sensibility of the second microlenses 12X and the third microlenses 14X to fabrication tolerances and surface micro-roughness. Therefore it can be advantageous to produce the second microlenses 12X and the third microlenses 14X with an ideal cutting direction 70, or with only some degrees deviation from the ideal cutting direction 70, whereas the less sensible first microlenses 12Y and fourth microlenses 14Y are fabricated with larger deviations from an ideal cutting direction 70. As has been mentioned above, deviations from the ideal cutting direction 70 in excess of about 20° usually result in significant deteriorations with respect to the surface roughness. However, in many cases such an increased surface roughness is tolerable for the only slightly curved first microlenses 12Y and the fourth microlenses 14Y.

2.5 Surface Profile Manipulation

Often it is desirable to be able to modify the curved surface profile of the microlenses produced with the fly-cut process. One incentive may be that it is difficult to fabricate microlenses having a non-circular surface profile. This is because the fabrication of a cutting edge 24 which is non-circular is a very sophisticated process and may involve, for example, the use of measurement equipment that is able to determine the curvature and the corrugation of the edge on a 10 nm scale. In contrast, the fabrication of tools 22 with a circular cutting edge 24 is much simpler and less expensive. Therefore it may often be advantageous to manufacture microlenses having a circular surface profile in a fly-cut process, and to modify this profile afterwards with other mechanisms.

Another motivation to modify the surface profiles is to selectively change the angular distribution of the light impinging on the mask plane 18. The angular distribution determines the telecentricity properties of the illumination system, for example, and may be modified by changing the curved surface profile of the third microlenses 14 only in certain areas on the surface of the second integrator members 14.

Figure 10:
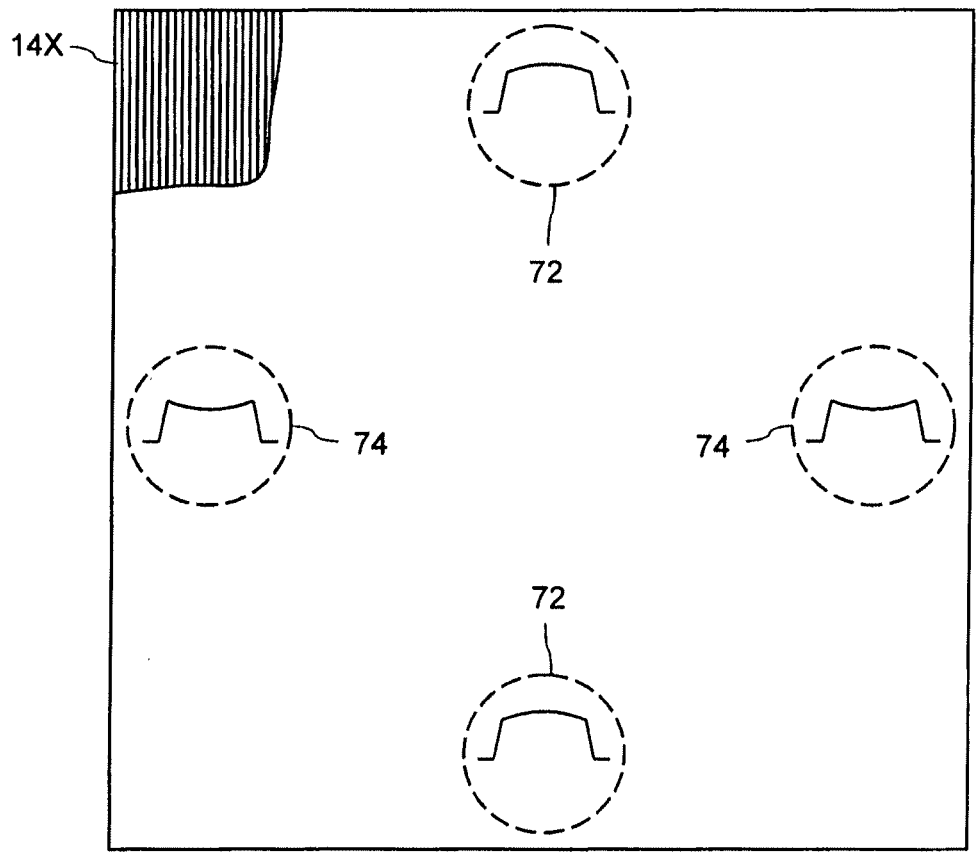
FIG. 10 is a top view on a microlens array with areas in which the surface profiles of the microlenses differ, which results in intensity distributions indicated in circles.

This is explained with reference to FIG. 10 which shows a top view of the second integrator members 14. For the sake of clarity only some of the third microlenses 14X are shown in the upper left corner. The curved surface profile of the third microlenses 14X is modified in areas 72 such that more light energy is concentrated in the center of the light bundles emitted by the microlenses 14X in the areas 72. As a result, more light energy concentrates in the center of the mask plane 18, as it is indicated in FIG. 10 by continuous lines within the areas 72. Such a modified angular distribution may be produced by flattening the vertex zones of the third microlenses 14X.

In second areas 74 the curved surface profiles of the third microlenses 14X are modified in a different way.

Here the modification is carried out such that more light energy is refracted into larger angles, which results in an intensity distribution in the mask plane 18 where light energy is shifted from the center to the margins of the illuminated field in the X direction (see continuous lines in areas 74). Such a modification may be carried out by removing material such that the curvature decreases towards the lateral sides of the third microlenses 14X.

Since the first areas 72 and the second areas 74 form two pairs of opposite poles, with the pairs being arranged perpendicularly to each other, a point in the center of the mask plane 18 receives more light from the directions associated with the first areas 72 and less light energy from the directions associated with the second areas 74. For a point at the margins (in X direction) of the illuminated field the same applies vice versa. This exploits the fact that for each light ray there is a relationship between the angle of incidence on the mask plane 18 on the one hand and the distance form the optical axis OA at which the light ray passes through the second integrator member 14 on the other hand (see also FIG. 2). As a result of the complementary intensity distributions produced by the microlenses within areas 72 and areas 74, each point on in the mask plane nevertheless receives the same amount of light energy.

As a matter of course, the particular modification shown in FIG. 10 is only exemplary. Various other modifications of the surface profile of the microlenses, which are restricted to certain areas on the second integrator member 14, are possible for a field dependent modification of the angular distribution. For example, the microlenses in the areas 72, 74 may produce different angular intensity distributions, or the number and/or position of the areas may be varied. As a matter or course, the surface profile of all microlenses 14X may be modified to different degrees as well. Thus surface profile modification restricted to certain areas of, or varying over, the total surface of the microlenses 14X is an excellent measure to selectively produce field dependent modifications of the angular distribution. The angular distribution directly determines the telecentricity and what is usually referred to as pupil ellipticity of the illumination sys-tern.

Yet another motivation to selectively modify the surface profiles is to improve the intensity uniformity in the mask plane. This will be explained in more detail further below in section 3.3.

In the following various methods are described that make it possible to selectively modify the curved surface profile of microlenses produced with a fly-cut process.

2.5.1. Polishing

The polishing methods described above in section 2.3 can be used to modify the curved surface profile of all microlenses of an array, for example in order to achieve the effect of an aspheric lens in a plane perpendicular to the longitudinal axes of the microlenses, or only within certain areas of the array. For example, with a polishing cloth it is possible to flatten the vertex zones of the microlenses. With other polishing methods, for example magnetorheologig fluids, it is even possible to abrade material selectively from the lateral sides of the microlenses.

2.5.2 Ion Beams

If the microlenses are exposed to a homogeneous ion beam, a plurality of ions impinges on the surface of the microlenses or portions thereof. The ions remove atoms from the surface of the microlenses with an abrasion or etch rate R that depends, among others quantities, on the material of the microlenses and also on the energy and current density of the ions. Furthermore, the etch rate R is a strong function of the local angle of incidence.

Figure 11:
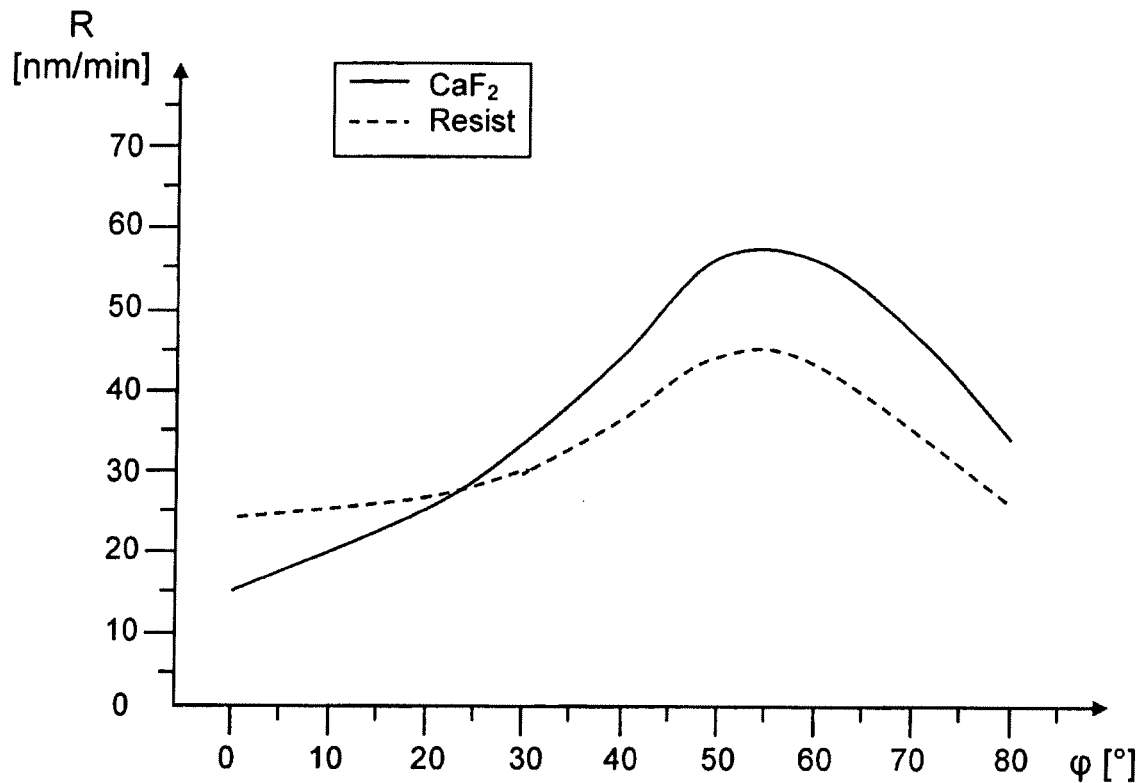
FIG. 11 is a graph showing the dependency of the etch rate from the angle of incidence for ion beam edging.
Figure 13:
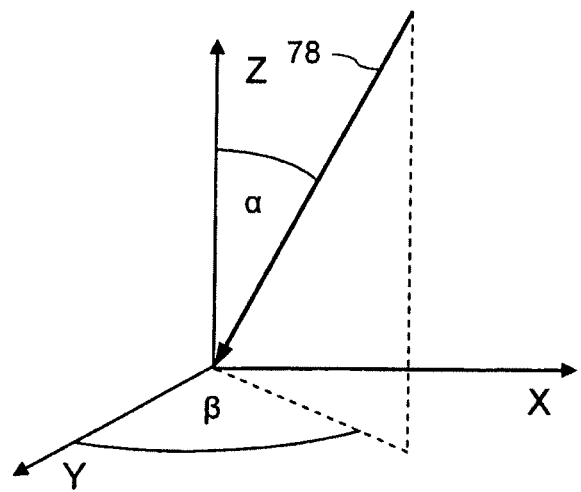
FIG. 13 illustrates the term azimuth angle and aperture angle.

The graph shown in FIG. 11 illustrates, for an ion energy of 500 eV, the dependency of the etch rate R on the local angle of incidence $\phi$ for $CaF_2$ (continuous line) and, for comparison, a resist (broken line).

The cross section of the ion beam is selected such that its maximum dimension is greater, such as by a factor of 5 or more, than the pitch of the microlenses. Since the ions move (at least substantially) all parallel to a common ion beam direction, this condition ensures that the local angle of incidence $\phi$, at which the ions impinge on the surface, varies along a direction which is perpendicular to the longitudinal axes of the microlenses. This becomes clear from FIG. 12 which shows a plurality of third microlenses 14X in a perspective view. In this embodiment an ion beam source 76 produces a homogeneous ion beam having an ion beam direction 78. The term "homogeneous" in the respect denotes the fact that the ion current density of the ion beam is (at least substantially) constant over the cross section of the beam. If the ion current density of the ion beam produced by the ion beam source 76 significantly falls off towards the outer portions of the beam, a diaphragm may be used as an ion stop that blocks those portions. The ion beam source 76 is capable of being rotated around two orthogonal axes 80, 82 so that the ion beam may be directed under any arbitrary angle onto the third microlenses 14X. If only microlenses shall be etched that extend in a common plane, it is usually simpler to rotate the substrate 30 using a tilt table, which holds the substrate 30, instead of rotating the ion beam source 76.

The substrate 30 with the third microlenses 14X formed on top is fixed to a positioning table that makes it possible to displace the microlenses 14X along orthogonal directions X and Y, as it is indicated by double arrows 84 and 86, respectively. In this way the area 87 on the third microlenses 14X exposed to the ion beam may be varied. As a matter of course, the exposed area 87 may have any geometry and may be either smaller or larger than is schematically shown in FIG. 12. For example, if the diameter of the ion beam is larger than the total surface of the second integrator member 14, all third microlenses 14X are simultaneously exposed to the ion beam at a given time. If the cross section of the ion beam has a maximum dimension which is smaller than the total surface of the second integrator, only a portion of this surface is simultaneously exposed to the ion beam. This may be advantageous if different areas of the third microlenses 14X shall be reworked differently, as has been explained above under section 2.5 with reference to FIG. 10. This may be used to remove ripples in the intensity distribution in the mask plane by exploiting an averaging effect, as will be explained in more detail below.

If $\alpha$ denotes the aperture angle formed between the ion beam direction and the Z direction, and $\beta$ denotes the azimuth angle between the ion beam direction 78 and the Y direction (see FIG. 13), the local angle of incidence φ on the curved surface of the microlenses 14X is given by equation (1):

$$\cos(\varphi) = \frac{\cos(\alpha) - \sin(\alpha)\sin(\beta)f'(x)}{\sqrt{1 + f'^2}(x)}$$

The function f(x) defines the curved surface profile of the microlenses.

If an ion beam is directed onto one or a plurality of microlenses, the dependency of the etch rate R on the local angle of incidence φ, and also the dependency of this angle φ on the surface profile f(x), ensures that the etch rate R varies over the surface of the microlenses. This, in turn, makes it possible to modify the surface profile of the microlenses in one go. In particular, there is no need to direct a very thin ion beam on a portion of a single microlens, and to vary the etch rate by controlling the etch time. Instead the surface profile modification is mainly determined by the angles α and β under which the ion beam is directed onto the microlenses 14X.

Since the etch rate R also depends on the material on which the ion impinge (see FIG. 11), a coating consisting of a carefully selected material, or including layers of different materials, may be deposited on the third microlenses 14X. The material of the coating then provides an additional degree of design freedom that may be exploited when the process parameters are determined that are used for obtaining the desired surface manipulation. If the material is an anisotropic crystal such as $CaF_2$, the etch rate R also depends on the crystal orientation. This should be considered when determining the parameters for the ion etch process.

Figure 14:
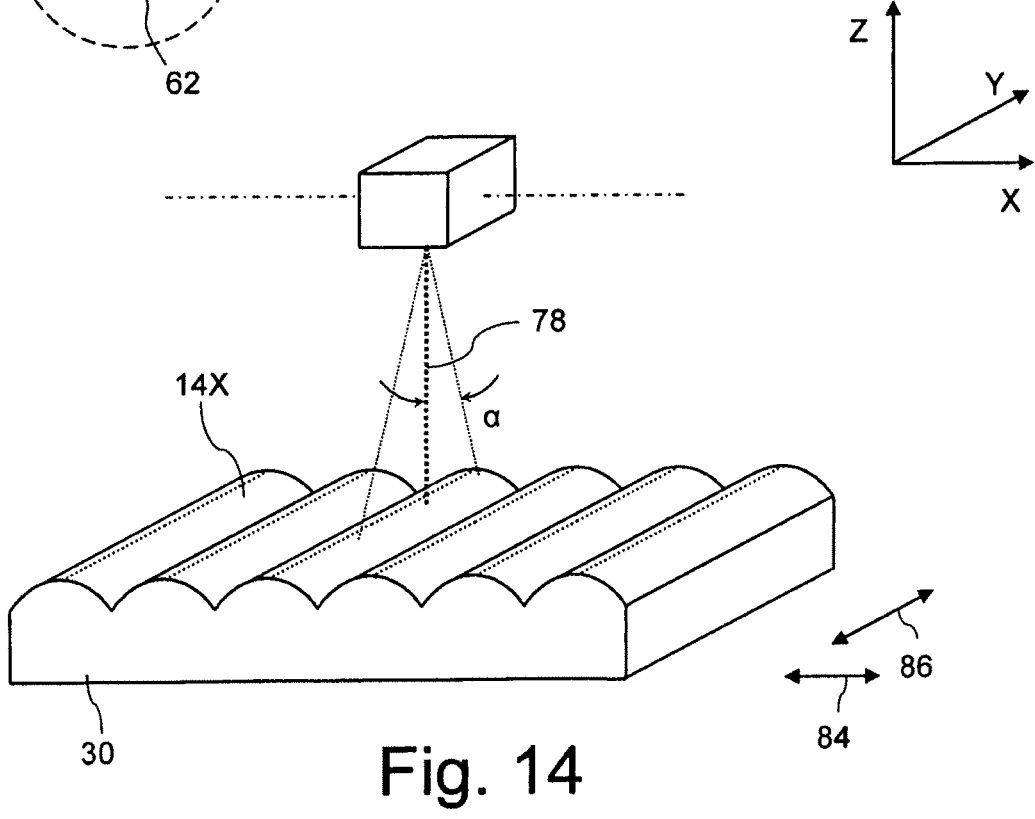
FIG. 14 shows another setup for ion beam edging in a representation similar to FIG. 11, but with an azimuth angle β=0°.
Figure 15:
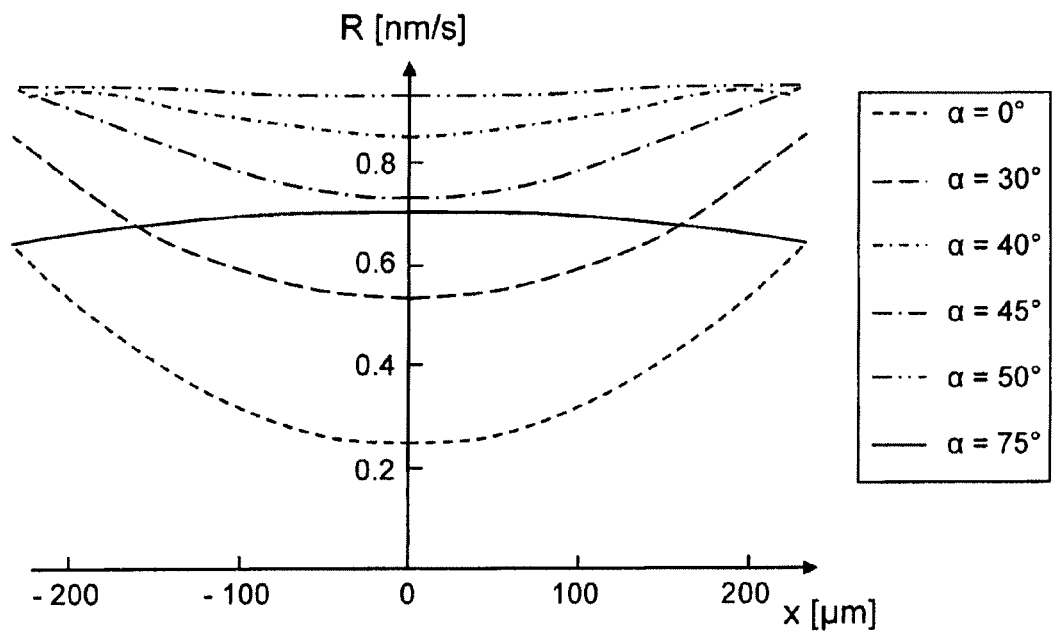
FIG. 15 shows a graph illustrating the dependency of the etch rate R from the aperture angle and the distance from the vertex line of the microlens.

FIG. 14 shows a first exemplary setup in which the azimuth angle β=0°. The ion beam direction 78 then lies in a plane of incidence which is parallel to the Y direction and perpendicular to the XY plane in which the third microlenses 14X extend. Such a setup ensures that the abrasion caused by the ion beam is symmetrical on both sides of each third microlens 14X. However, with such a setup it is difficult, even with larger aperture angles α, to obtain a significant abrasion on the vertex zone of each microlens. This is illustrated in the graph of FIG. 15 which shows the dependency of the etch rate R over the pitch of a single microlens for different aperture angles α. With the exception of the aperture angle α=75°, the etch rate R increases with increasing distance X from the vertex line of the microlens in the X direction.

Thus this setup with an azimuth angle β=0 is mainly suitable for surface profile modifications in which material shall be removed mainly from the lateral sides of the microlenses. Usually such a modification gives the profile a more triangular shape.

Often, however, it is desired to flatten the vertex zone in order to give a surface profile a more rectangular shape. In these cases it is better to use the second exemplary setup shown in FIG. 16 in which the azimuth angle β=90°. The ion beam direction 78 is then in planes of incidence perpendicular to the Y direction.

Figure 17:
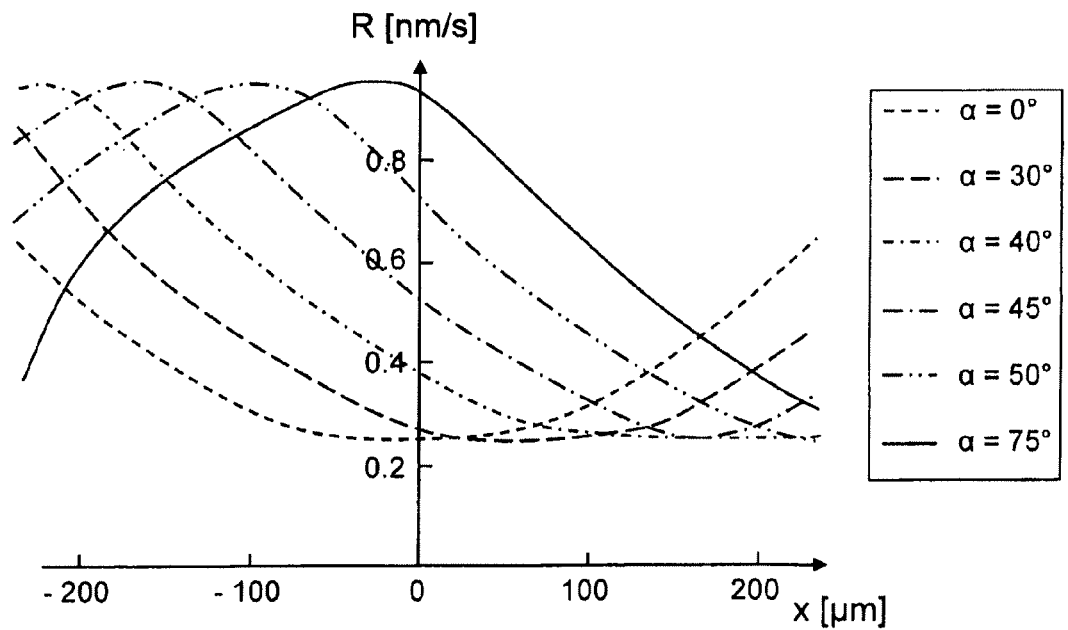
FIG. 17 is a graph similar to FIG. 15 for the setup shown in FIG. 16.
Figure 16:
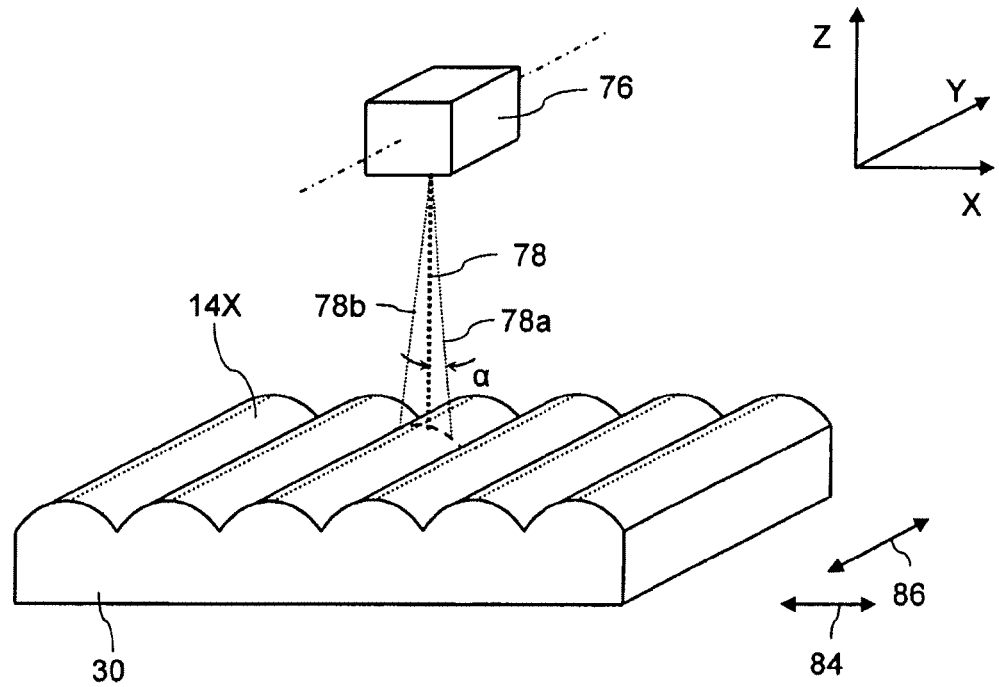
FIG. 16 shows another setup for ion beam edging in a representation similar to FIG. 12, but with an azimuth angle β=90°.

As is shown in the graph of FIG. 17, the etch rate R now varies more strongly, and with a large aperture angle α=75° the maximum etch rate R is achieved almost at the vertex line of the microlens (x=0). However, for aperture angles OC≠0° the etch rate R is not symmetrical with respect to the vertex line (x=0). This means that the surface profile of the third microlenses 14X would be deformed asymmetrically with respect to the vertex lines. Since this is, at least generally, not desirable, an additional ion beam etching process has to be carried out with an ion beam having the same azimuth angle β=90°, but with an aperture angle α. In FIG. 16 ion beam directions 78a, 78b of two such ion beams having opposite aperture angles α are indicated as dotted lines.

An exposure of the microlenses to two ion beams having different ion beam directions 78a, 78b may be carried out subsequently with a single ion beam source 76 that is tilted or otherwise adjusted between the two etching processes. The same effect is obtained with the help of an additional ion beam source which is appropriately arranged above the third microlenses 14X. The provision of two ion beam sources makes it possible to achieve a reduction of the machining time by a factor of two.

Figure 18:
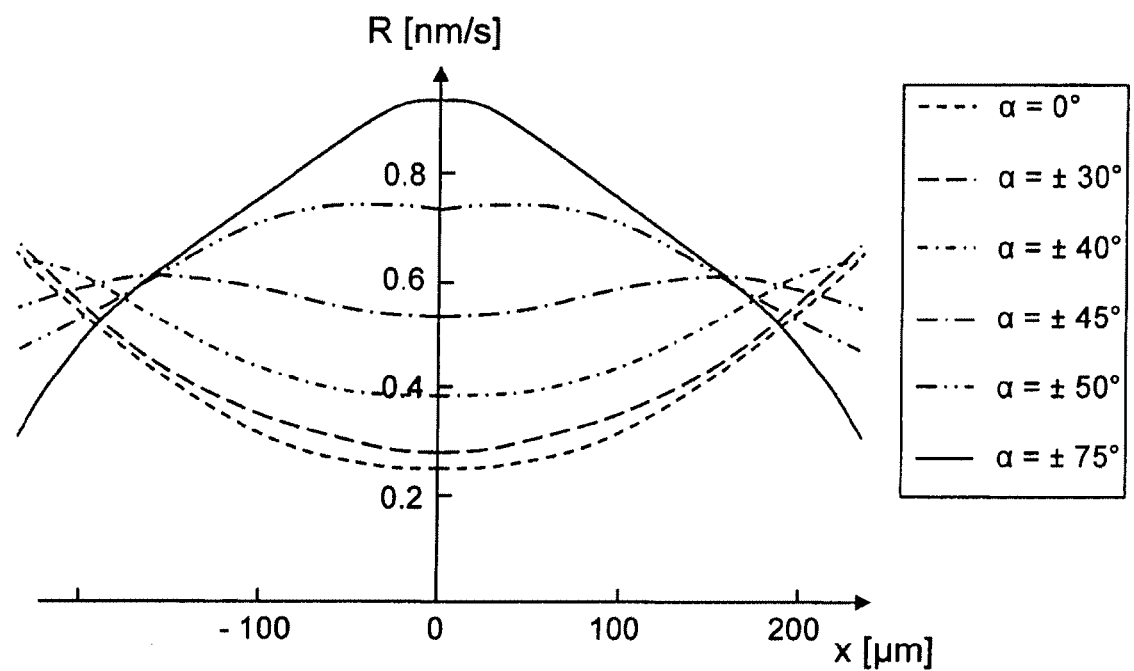
FIG. 18 is a graph similar to FIG. 17, but with ion beams directed symmetrically to both sides of the microlenses.

The graph of FIG. 18 shows the total etch rate R which is obtained if two ion beams, are directed from both sides onto the third microlenses 14X. The total etch rate R is now symmetrical also for aperture angles α≠0°, and for larger aperture angles α>50° the etch rate R is greater on the vertex lines of the microlenses than further away from the vertex lines. Thus this setup with an azimuth angle β=90° will usually be desired if microlenses shall be flattened at their vertex zones.

It is also possible to vary the aperture angel α during the exposure of the microlenses. This provides an additional degree of design freedom that may be exploited when the process parameters are determined that are used for obtaining the desired surface manipulation.

It should be noted that the foregoing description of the ion beam etching process exemplarily relates to the third microlenses 14X. As a matter of course, other microlenses, and in particular the second microlenses 12X, may be reworked using ion beams in the same manner as has been described above.

3. Geometry Variations

In the following certain variations of the geometry of the microlenses are described. The variations, which may be produced using the fly-cut process, are intended to partly destroy the strict geometric correlation between the second and third microlenses 12X, 14X. If not all second microlenses 12X illuminate the corresponding third microlenses 14X in exactly the same manner, the intensity distributions produced by the third microlenses 14X in the mask plane 18 will be slightly shifted along the X direction. This results in an improved uniformity of the intensity distribution in the mask plane, as will be explained in detail below.

Of course, she same approach may also be applied, mutatis mutandis, for the first and fourth microlenses 12Y, 14Y. However, the uniformity of the intensity distribution along the Y direction is often of little concern since the scanning movement of the mask produces an averaging effect anyway. For that reason the following description always relates to the second and third microlenses 12X, 14X that produce the intensity distribution along the X direction.

3.1 Pitch Variation

Figure 19:
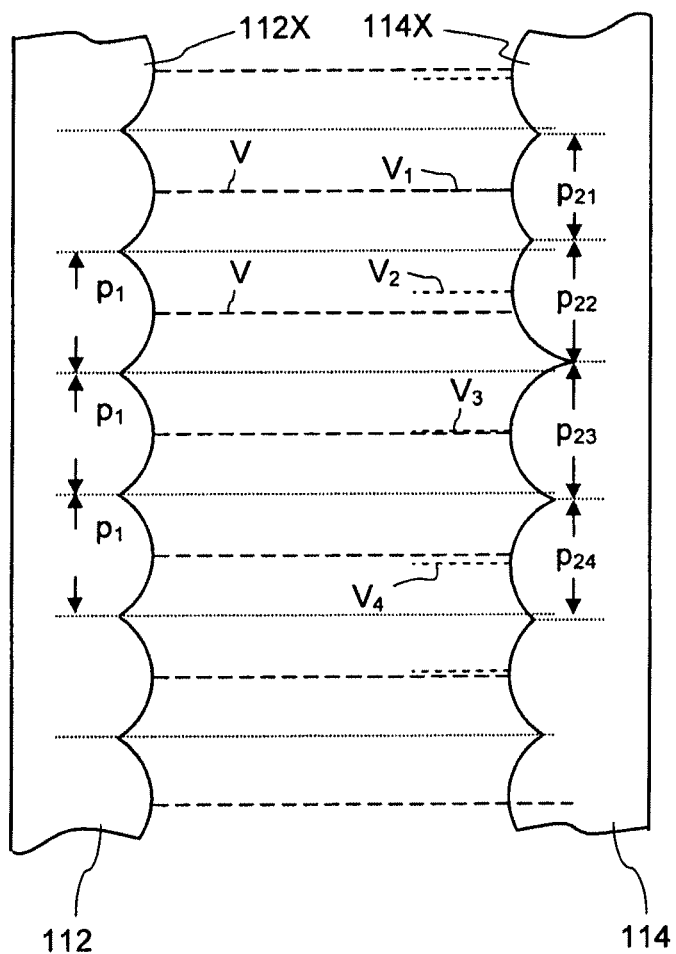
FIG. 19 is a side view of two opposing microlens arrays, wherein the microlenses of one array has varying pitches.

FIG. 19 shows an enlarged cross section through first and second integrator members 112, 114. In this embodiment it is assumed that the second microlenses 112X of the first integrator member 112 are regularly arranged with equal pitches pi and all have the same surface profile. The third microlenses 114X arranged on the second integrator member 114 have circular surface profiles with the same radius of curvature. However, the pitches $p_{21}, p_{22}, \ldots p_{2n}$ of the third microlenses 114X vary. In this embodiment the variation of the pitches $p_{21}, p_{22}, \ldots p_{2n}$ follows an equipartition function so that all pitches $p_{21}, p_{22}, \ldots p_{2n}$ within a certain range occur with the same occurrence. Since the mean value of the pitches $p_{21}, p_{22}, p_{2n}$ is the same as the pitch pi of the first integrator member 12, there is nevertheless a one to one correspondence between opposing second and third microlenses 112X, 114X. As a result of the pitch variation, vertex lines V of the second microlenses 112X generally do not coincide any more with vertex lines $V_1, V_2, \ldots, V_n$ of the corresponding third microlenses 114X. Instead, the distance between corresponding vertex lines varies also in accordance with an equipartition function.

Figure 20:
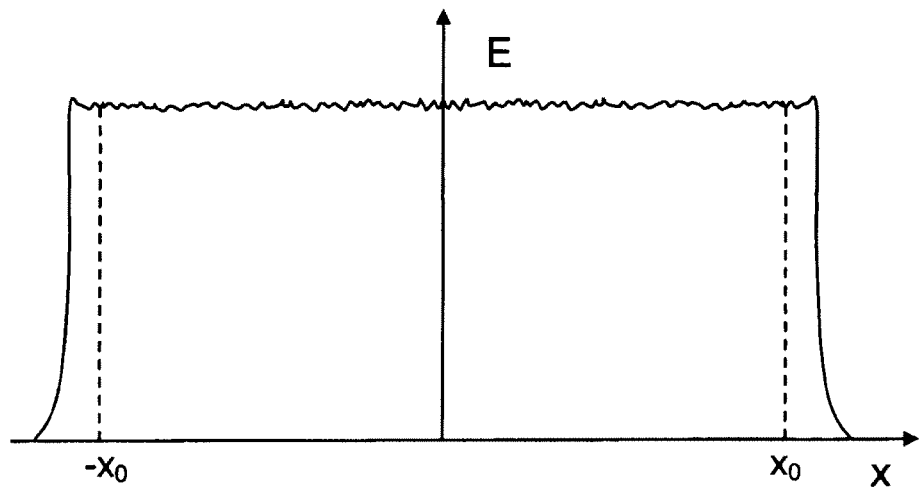
FIG. 20 is a graph showing the intensity distribution in the mask plane produced by a single microlens.

FIG. 20 is a graph showing an intensity distribution E(x) as a function of the x coordinate in the mask plane 18 produced by a single third microlens 114X. The surface profile of the third microlenses 114X is determined such that the intensity distribution in the mask plane 18 along the x direction is, at least within the illuminated field (i.e. x coordinate between $-x_0$ and $+x_o$), almost flat.

However, for various reasons, such as a residual surface roughness of the microlenses 114X, the intensity distribution is not perfectly flat, but displays a plurality of ripples having small amplitudes and a high frequency, as it is schematically indicated in FIG. 20. If all third microlenses are assumed to produce the same intensity distribution as shown in FIG. 20, a superimposed intensity distribution would result in a total intensity distribution in which the ripples are, in absolute terms, due to the superposition even stronger than for a single third microlens. Due to manufacturing tolerances, however, the third microlenses will never be perfectly equal, and consequently the intensity distributions produced by the third microlenses in the mask plane 18 also slightly vary. The superposition of such slightly varying intensity distributions results in an averaging or smearing effect that partly eliminates the ripples observed in the intensity distribution of each single third microlens 114X.

However, larger ripples that may be produced by flaws in or wear of the cutting edge 24, for example, may be present in all third microlenses, and the resulting ripples in the total intensity distribution of all third microlenses in the mask plane 18 will be clearly detectable. Even without larger ripples, the averaging effect may not be sufficient to sufficiently eliminate the ripples in the total intensity distribution of all third microlenses.

Since the pitches $p_{21}, p_{22}, \ldots p_{2n}$ of the third microlenses 114X vary in the embodiment shown in FIG. 19, the distance between corresponding vertex lines varies as well, as has been explained above. As a result, the third microlenses 114X are illuminated by the second microlenses 12X in different ways, namely with illumination bundles that are laterally displaced along the X direction to different extents. This, in turn, will cause the intensity distributions produced by each third microlens 114X to be shifted along the X direction by a slight distance. This distance is proportional to the distance by which a vertex line $V_2k$ of a third microlens 114X is laterally displaced with respect to the vertex line V of the corresponding second microlens 112X.

Figure 21:
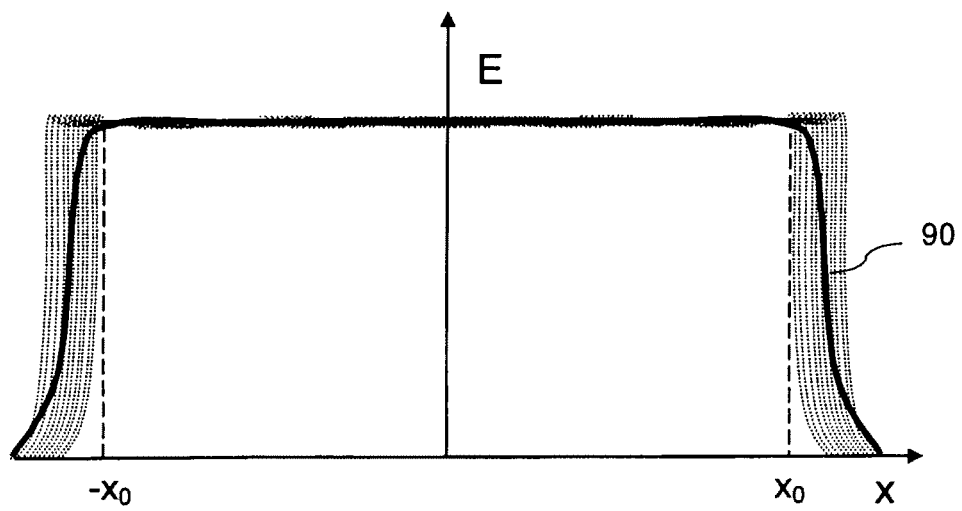
FIG. 21 is a graph showing the total intensity distribution in the mask plane obtained by the superposition of the intensity distributions of all microlenses of the microlens array shown in FIG. 19.

In FIG. 21 a plurality of intensity distributions as shown in FIG. 20 are indicated by dotted lines. The intensity distributions are displaced along the X direction by distances which are given by an equipartition function. Thus each distance is, within a given range, present with the same occurrence. The strong continuous line indicated by 90 represents the total intensity distribution obtained by superimposing all intensity distributions produced by the individual third microlenses 114X. It can be seen that, due to the averaging effect of the slightly displaced intensity distributions, the total intensity distribution 90 is now almost completely flat within the illuminated field (x coordinate between $-x_o$ and $+x_o$). As a result of the lateral displacement of the intensity distributions in the mask plane 18, some light is lost. This is represented in FIG. 21 by the broader slopes of the total intensity distribution 90 outside the illuminated field. This loss of light may be compensated for by a slightly increased light energy per time unit produced by the light source of the illumination system, for example.

As a matter of course, the same effect is achieved if not the third microlenses 114X, but the second microlenses 112X have varying pitches. Furthermore, it is possible that both the second and the third microlenses 112X, 114X have a varying pitch. For the sake of simplicity the following description how microlenses with varying pitches may be produced only refers to the third microlenses 114X.

In the following it is described how third microlenses 114X having varying pitches may be produced using the fly-cut process. FIGS. 22a to 22l show a cross section through the substrate 30 at various subsequent steps during the manufacture of the third microlenses 114X. It is assumed that the substrate 30 moves along a direction which is perpendicular to cutting edge 24 during these steps.

Figure 22A:
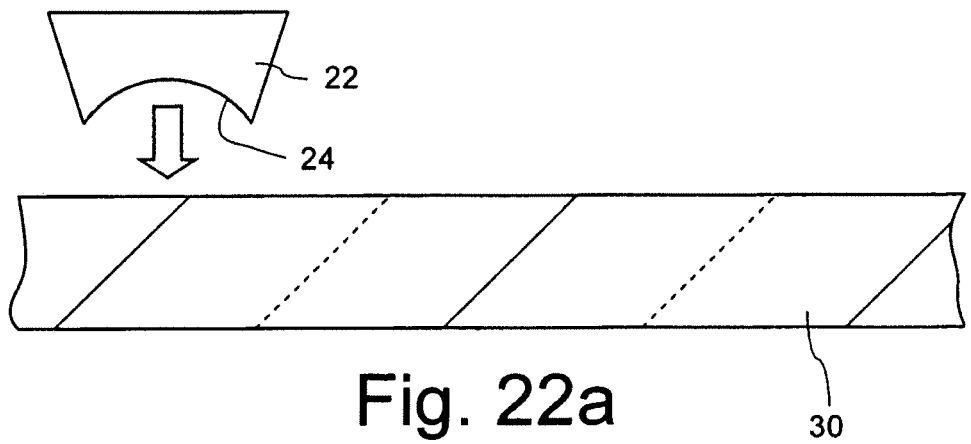
FIGS. 22a to 22l illustrate the manufacture of microlenses having a varying pitch with a single cutting tool.
Figure 22B:
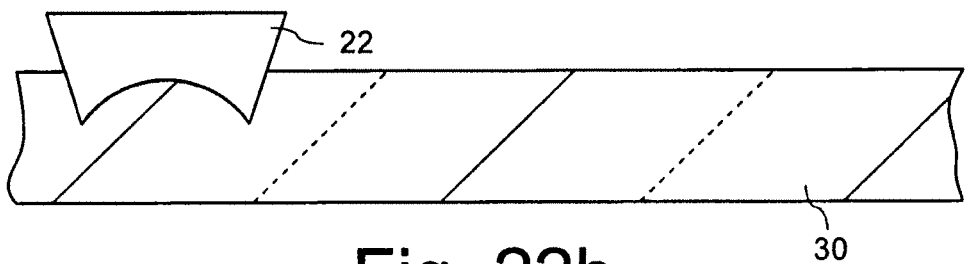
Figure 22C:
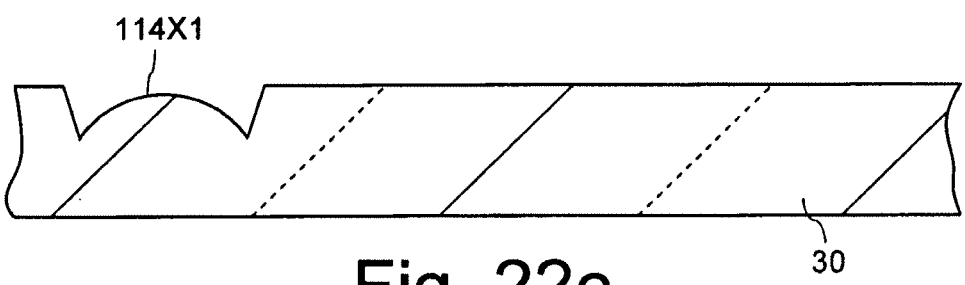
Figure 22D:
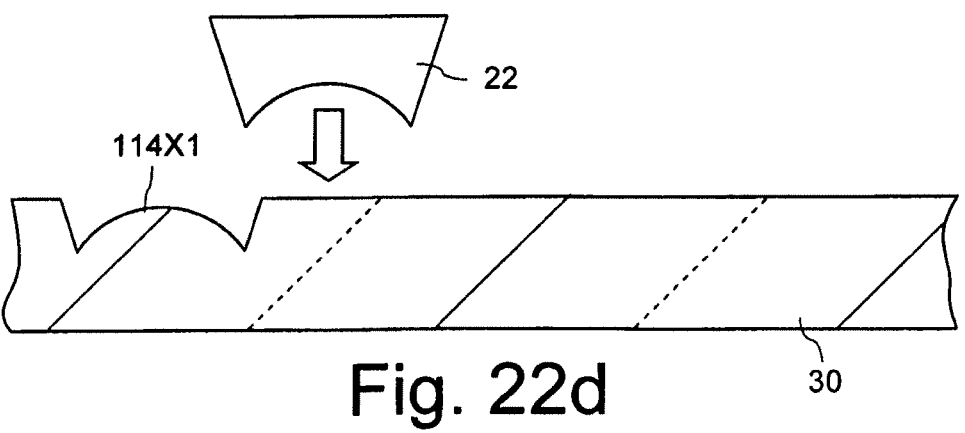

In FIG. 22a it is indicated how the tool 22 with its cutting edge 24 moves towards the substrate 30. In FIG. 22b it can be seen how the tool 22 cuts into the substrate 30 when it dips into the latter during the rotation around the rotational axis 28. FIG. 22c shows the substrate 30 with material removed by the tool 22 so that a first microlens 114X1 is formed.

After the first microlens 114X1 has been completely formed, the substrate 30 is displaced sideward so that the next microlens can be formed which is arranged side by side to the microlens 114X1.

Figure 22E:
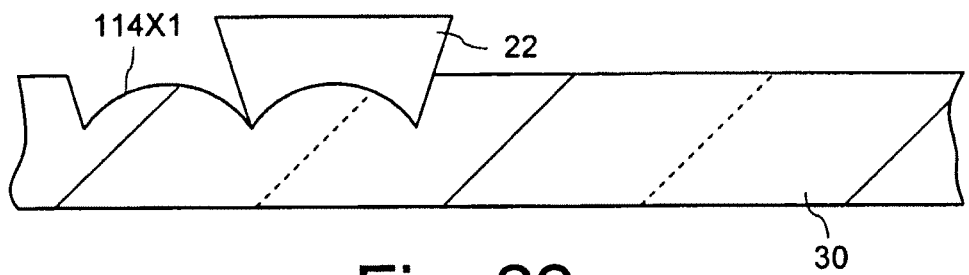
Figure 22F:
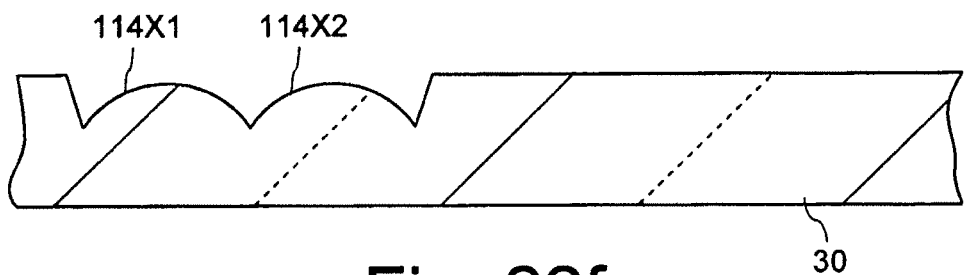
Figure 22G:
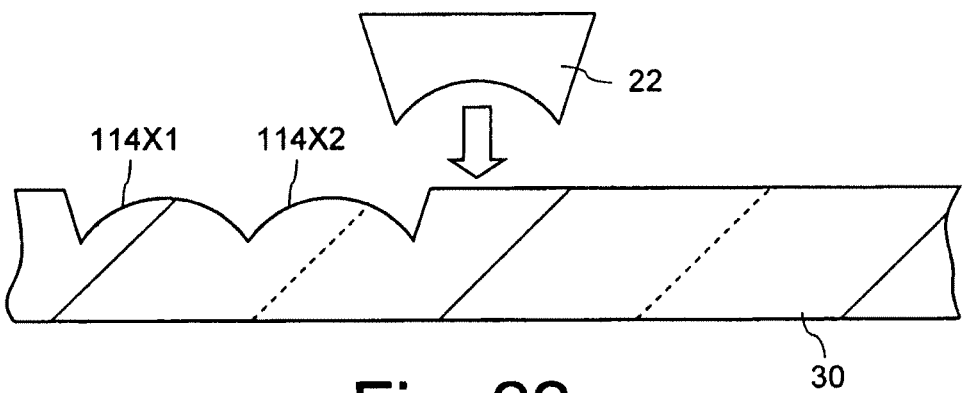
Figure 22H:
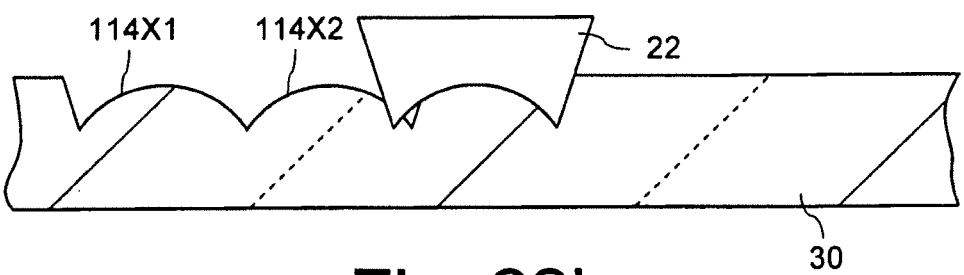
Figure 22I:
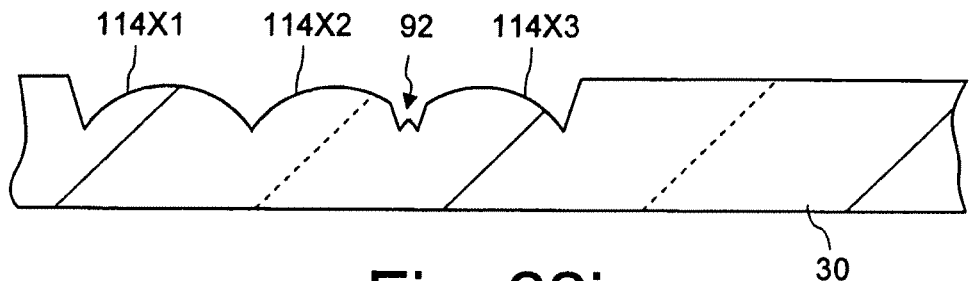
Figure 22J:
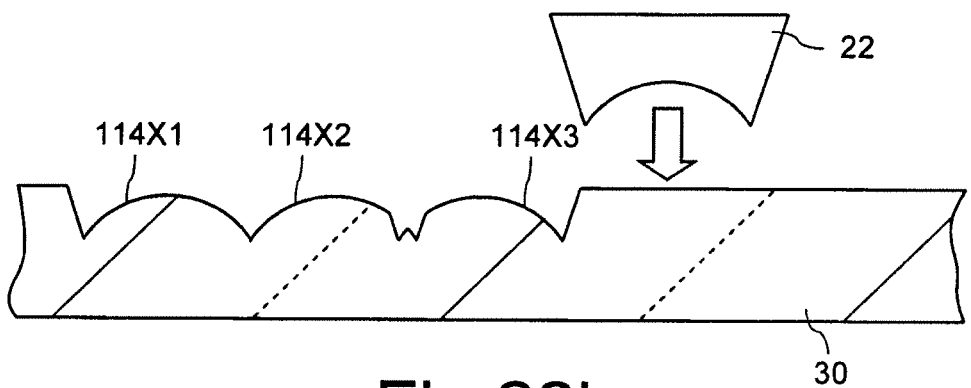
Figure 22K:
Figure 22L:
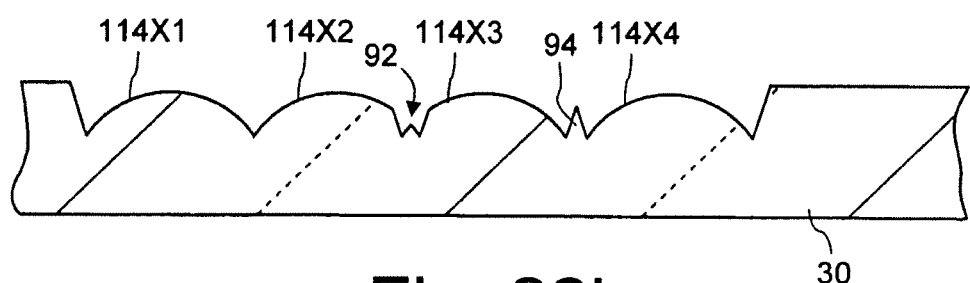

FIGS. 22e and 22f correspond to the FIGS. 22b and 22c. In FIG. 22f it can be seen that a second microlens 114X2 has been formed which has the same pitch as the first microlens 114X1.

After the second microlens 114X2 has been formed, the substrate 30 is again displaced sideward, but now by a smaller distance. As a result the tool 22 partly cuts into the second microlens 114X2 which results in a W-shaped groove 92 formed between the second microlens 114X2 and the third microlens 114X3.

After the manufacture of the third microlens 114X3 is completed, the substrate 30 is displaced again sideward, but now by a distance which is larger than the distances before. As a result, the fourth microlens 114X4 produced by the tool 22 is now spaced apart from the third microlens 114X3 by a ridge 94 having a triangular profile.

From FIGS. 22a to 22l it becomes clear that the manufacture of microlenses having varied pitches produces undesired grooves 92 or ridges 94 between adjacent microlenses that could, in principle, deteriorate the performance of the microlens array. However, for the sake of clarity the grooves 92 and the ridges 94 are significantly enlarged. In a real microlens array the pitch variations are very small and may not exceed 1% of the average pitch. Consequently, the grooves 92 and the ridges 94 are so small that any adverse effects on the optical properties are significantly offset by the improvements obtained by the superposition of slightly displaced intensity distributions in the mask plane 18.

In this context it should be noted that at the edges where adjacent microlenses abut there are differences to the ideal shape anyway, as has been explained above with reference to FIG. 12.

3.2 Longitudinal Axis Variation

Figure 23:
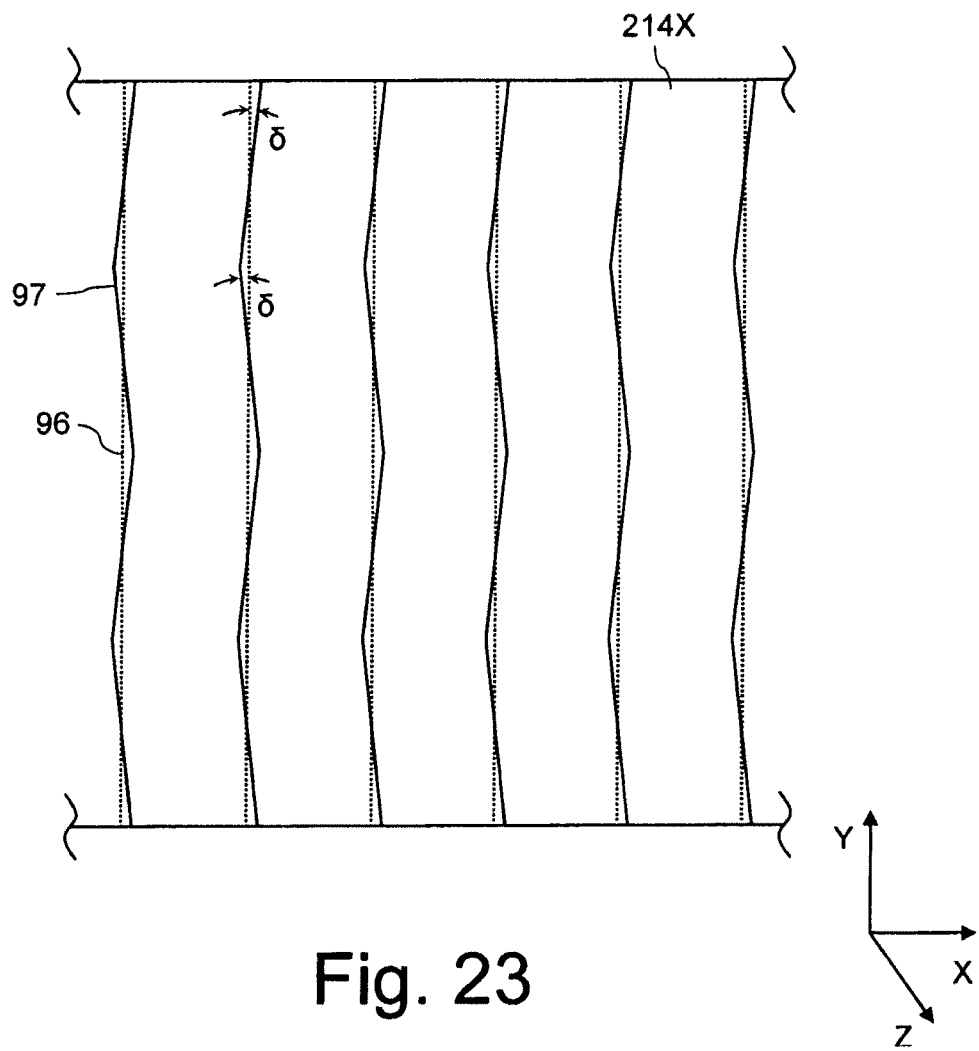
FIG. 23 is a top view of a microlens array in which the longitudinal axes of the microlenses are parallel to a zigzag line.
Figure 24:
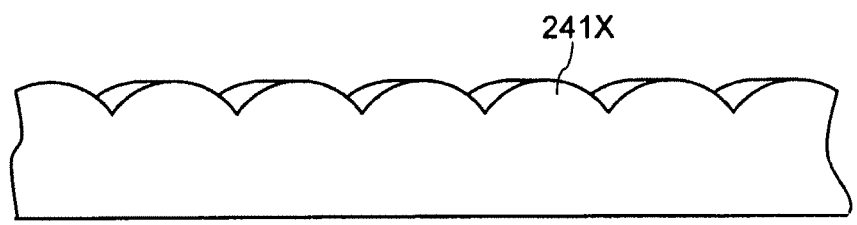
FIG. 24 is a side view of the microlens shown in FIG. 23.

FIGS. 23 and 24 show an array of third microlenses 214X according to another embodiment in a top view and a side view, respectively. In this embodiment the third microlenses 214X extend parallel to each other, but their longitudinal axes are inclined with respect to the longitudinal axes of the second microlenses 12X. The regular array of second microlenses 12X is indicated in FIG. 24 by dotted borderlines 96 where adjacent second microlenses 12X abut.

The third microlenses 214X may be considered as including a plurality of different portions that are aligned one behind the other. The portions have longitudinal axes and vertex lines that form zigzag lines. Since all third microlenses 214X are arranged in parallel, which implies an equal pitch for all microlenses along their entire length, also borderlines 97 where adjacent third microlenses 214X abut form zigzag lines. As can be clearly seen, the zigzag borderlines 97 of the third microlenses 214X "wind" around the straight borderlines 96 of the corresponding second microlenses 12X.

The same also applies for the vertex lines of the third microlenses 214X with respect to the vertex lines of the second microlenses 12X. Therefore the borderlines 96 and 97 shown in FIG. 23 may equally represent vertex lines of a microlens array that is laterally displaced by one half of the microlens pitch. The top view of FIG. 23 may then be regarded as a projection of the vertex lines of the second microlenses 12X and the third microlenses 214X along the optical axis (i.e. Z direction) of the optical integrator 10.

This zigzag configuration ensures the one to one correspondence between the second microlenses 12X and the third microlenses 214X is maintained. Since the zigzag line is regular with an inclination angle of δ, the lateral shift of the vertex lines of the third microlenses 214X with respect to the vertex lines of the corresponding second microlenses 12X also follows an equipartition function. Due to the lateral displacements of the third microlenses 214X with respect to the second microlenses 12X, the third microlenses 214X are illuminated by the second microlenses 12X in different ways, namely with illumination bundles that are laterally displaced along the X direction to different extents. The extent of the displacement continuously varies along the Y direction for each single pair of corresponding microlenses. This, in turn, will cause the intensity distributions produced by each third microlens 214X to be shifted along the X direction by a slight distance. Thus essentially the same effect is achieved as it is shown in FIG. 21 for the third microlenses 114X of the embodiment shown in FIG. 19.

As a matter of course, a similar effect is achieved if the axes of the third microlenses do not form zigzag lines, but serpentines (i.e. continuously curved lines), or zigzag lines having a more complicated form than shown in FIG. 23. Furthermore it should be noted that also in this embodiment only the second microlenses 12X, or both the second and third microlenses 12X, 214X, may have adjacent portions with longitudinal axes that form zigzag lines or serpentines of various shapes.

For manufacturing such microlenses the fly-cut process may be used as well. For example, for producing microlenses having a serpentine longitudinal axis, it is only slow rotate of the turn table 44 around the rotational axis 46 during the fly-cut process may be involved.

3.3 Surface Profile Variation

It has already been mentioned that the profile shape modifications described above in section 2.5 may advantageously be used also for improving the uniformity of the intensity distribution in the mask plane 18. By polishing or ion beam etching individual microlenses or portions thereof, it is possible to selectively produce surface profile variations that increase the variations that are already present due to fabrication tolerances. By carefully designing these variations it is possible to increase the averaging effect obtained by the superposition of different intensity distributions in the mask plane 18 to such an extent that an almost perfectly uniform intensity distribution is achieved.

In the following alternative methods are explained how the surface profile may be selectively varied with very simple mechanisms.

3.3.1 Interleaved Microlens Manufacturing Sequence

During the manufacture of a microlens array the cutting tool 22 is usually subject to wear which affects the geometry and cutting quality of the cutting edge 24. Usually the microlenses are manufactured one after the other so that a new microlens is manufactured immediately adjacent an already existing one. Then the surface profiles of adjacent microlenses are almost identical, but will vary slightly over the entire surface of the array due to the increasing wear of the cutting tool 22. This introduces a systematic error in the uniformity distribution which cannot be easily corrected by other mechanisms.

These adverse effects can be avoided by using a manufacturing process in which the microlenses are manufactured in an interleaved manufacturing sequence. What this means is illustrated in FIGS. 25a to 25e which show the substrate 30 and the tool 22 in cross sections at various subsequent stages during the manufacturing process.

After the first microlens 314X11 has been formed (FIG. 25a), the substrate 30 is moved sideward by a multiple of microlens pitches (FIG. 25b) before the second microlens 314X12 is formed. The same applies also for the third microlens 314X13 after the manufacture of the second microlens 314X12 has been completed (FIG. 25c), etc.

Figure 25A:
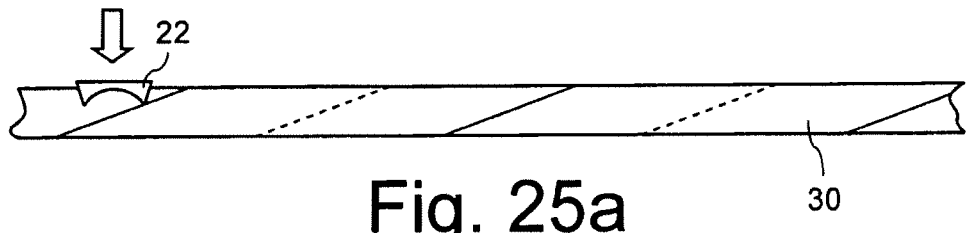
FIGS. 25a to 25e illustrate the manufacture of a microlens array with an interleaving microlens formation.
Figure 25B:
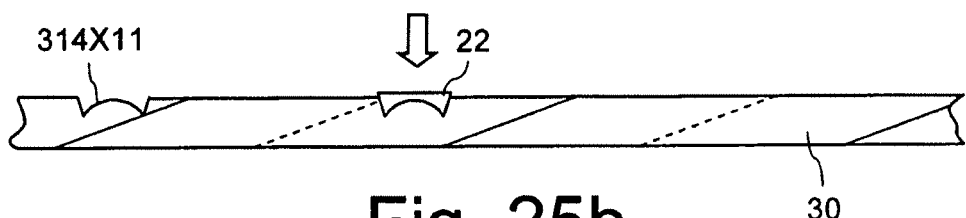
Figure 25C:
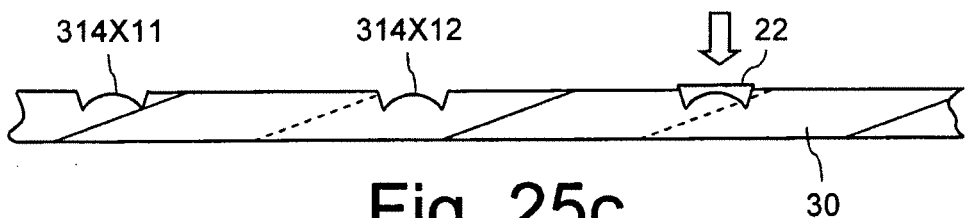
Figure 25D:
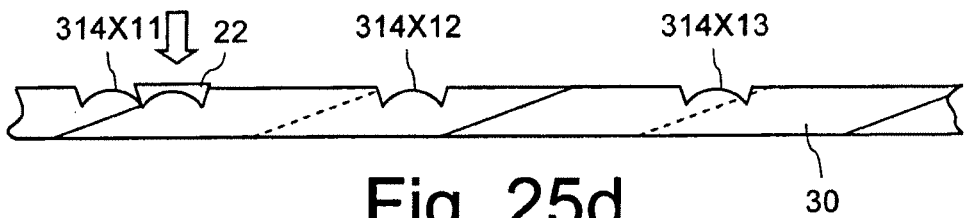
Figure 25E:
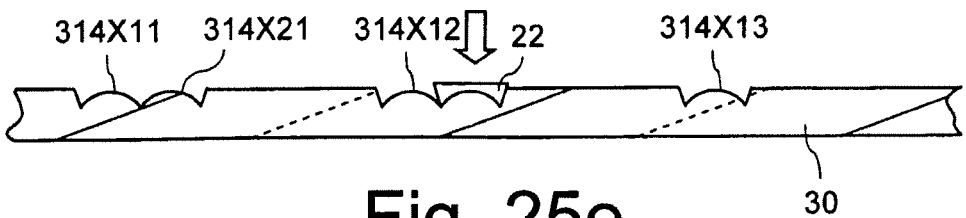

After the entire surface of the substrate has been covered with microlenses 314X11, 314X12, 314X13, . . . , 314X1n spaced apart by a multiple of the microlens pitch, a second array of equally spaced microlenses 314X21, 314X22, 314X23, 314X2n is manufactured in the same manner, as is shown in FIGS. 25d and 25e.

This interleaved manufacturing sequence ensures that the differences between the surface profiles of adjacent microlenses may be significantly enough to achieve an averaging effect similar to what has been explained above in sections 3.1 and 3.2. Nevertheless there is no systematic change of the surface profile in a direction perpendicular to the longitudinal direction of the microlenses.

3.3.2 Reworking with Cutting Tool

After the complete array of microlenses has been manufactured on the substrate 30, some, for example every second or every third, microlens may be reworked using the same or desirably a slightly different cutting tool 22, thereby producing a surface profile variation.

Figure 26:
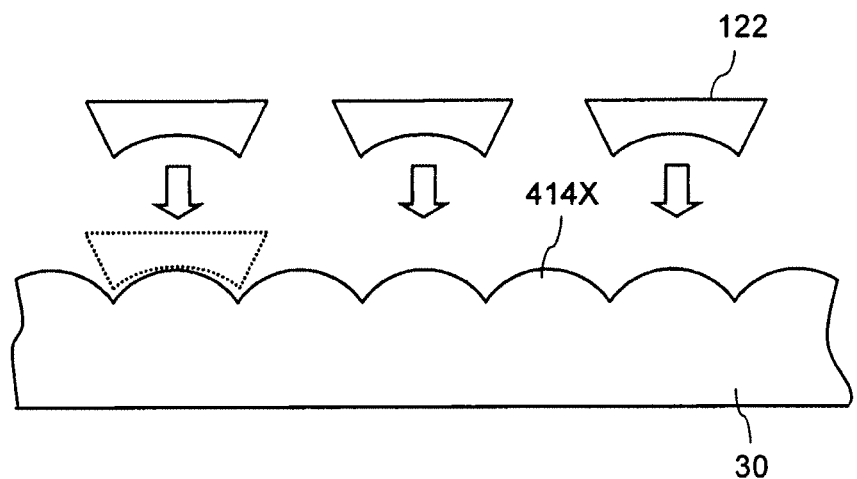
FIG. 26 is a side view of a microlens array illustrating the rework process.

FIG. 26 illustrates how every second of third microlenses 412X is reshaped with a tool 122 which is different from the tool that formed the third microlenses 412X in a first run. As a matter of course, the microlenses 412X may be reworked also with more than one additional tool 122.

Figure 27:
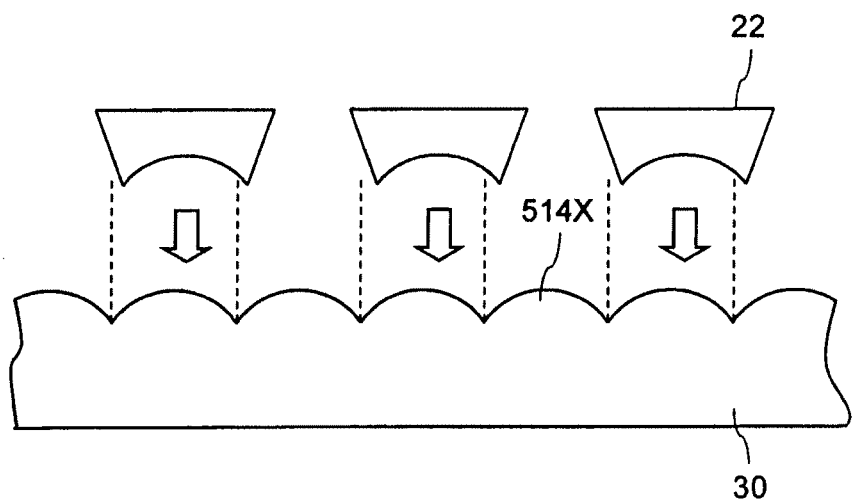
FIG. 27 is a side view similar to FIG. 26.

FIG. 27 illustrates an alternative method in which all or only some of the microlenses 512X are reworked with the same tool 22 that has been used for the manufacture of the microlenses 512X in the first run. However, the substrate 28 is positioned with respect to the spindle 26 such that the microlens to be reworked is slightly laterally offset with respect to the tool 22. This results in pitch variations similar to those described above with reference to FIG. 19.

3.3.3 Different Tools

Figure 29:
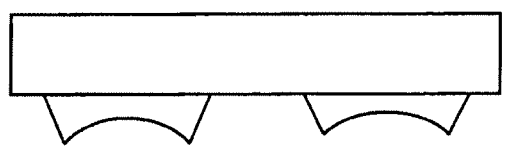
FIG. 29 is a schematic front view of a multi-edge cutting tool.

A very simple way to produce microlenses having different surface profiles or pitches is to use different cutting tools that are specifically adapted to the desired surface profile and/or pitch. FIG. 29 shows a cross section through a microlens array in which third microlenses 614X all have the same pitch, but different radii of curvature which are denoted by $r_1$ to $r_4$. The different curvatures are significantly exaggerated in FIG. 29 for the sake of clarity; in real microlens arrays the radius of curvature variations may be as small as one percent. If such an array of microlenses 614X is illuminated by a regular array of second microlenses 12X, four intensity distributions having different widths will be superimposed in the mask plane 18. This will significantly reduce undesired ripples in the overall intensity distribution.

For manufacturing the third microlenses 614X, the interleaved manufacturing sequence explained above in section 3.3.1 with reference to FIGS. 25a to 25e can be applied, wherein each array of parallel and spaced apart microlenses is formed with a different cutting tool 22.

3.3.2 Multi-Edge Tool

Instead of using a tool having only a single cutting edge, a tool may be used on which several cutting edges are arranged side by side. The more cutting edges are provided on the multi-edge tool, the shorter will be the total machining time for manufacturing the microlens array.

Figure 28:
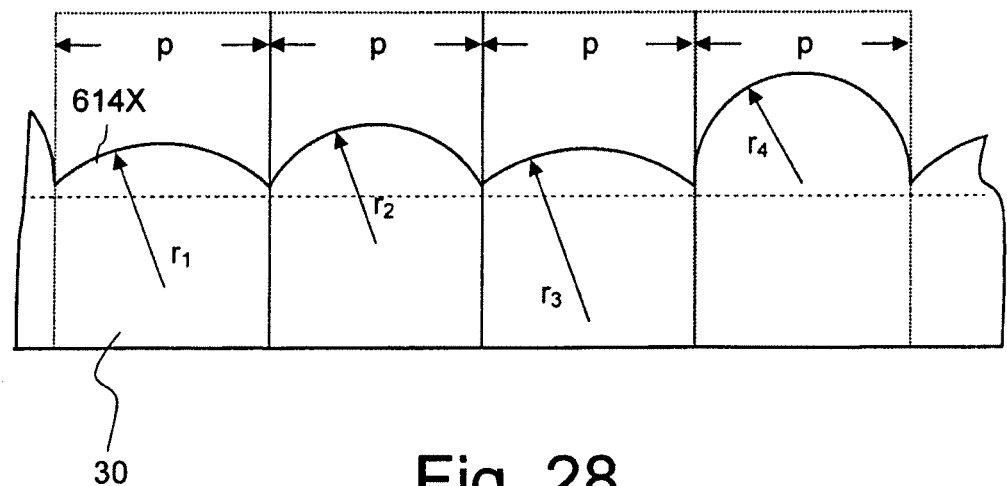
FIG. 28 is a section through a microlens array in which the microlenses have surface profiles with different circular curvatures.

The provision of a multi-edge tool makes it possible to produce in a single fly-cut cycle a plurality of microlenses having different surface profiles and/or pitches. For example, for manufacturing the third microlenses 614X shown in FIG. 28 a four-edge cutting tool may be used that forms four adjacent microlenses 614X in one fly-cut cycle.

FIG. 29 shows a schematic front view of a tool 222 including two different cutting edges 224a, 224b. Here the cutting edges 24a, 24b are spaced apart by one microlens pitch. Such an arrangement may be advantageous for reworking an array of microlenses in a way similar to what is shown in FIG. 21.

Figure 30:
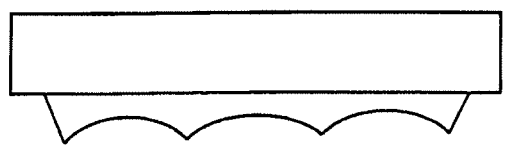
FIG. 30 is a front view of a multi-edge cutting tool.

FIG. 30 is a front view of a multi-edge tool 322 having three adjacent cutting edges 324a, 324b, 324c. The multi-edge tool 322 is optimized for manufacturing a periodic array of groups of adjacent microlenses, wherein the microlenses within one group have different surface profiles. With the tool 322 it is possible that no tool changes are involved during the manufacturing process.

4. Scattering Plates

As has been mentioned above, the fly-cut process with its different embodiments described in sections 2 and 3 may also be advantageously used for the production of other kinds of elongated microlenses. For example, international patent application PCT/EP2007/001267, whose full disclosure is incorporated herewith by reference, proposes to use scattering plates having parallel arrays of microlenses in illumination systems of microlithographic projection exposure apparatus.

Figure 31:
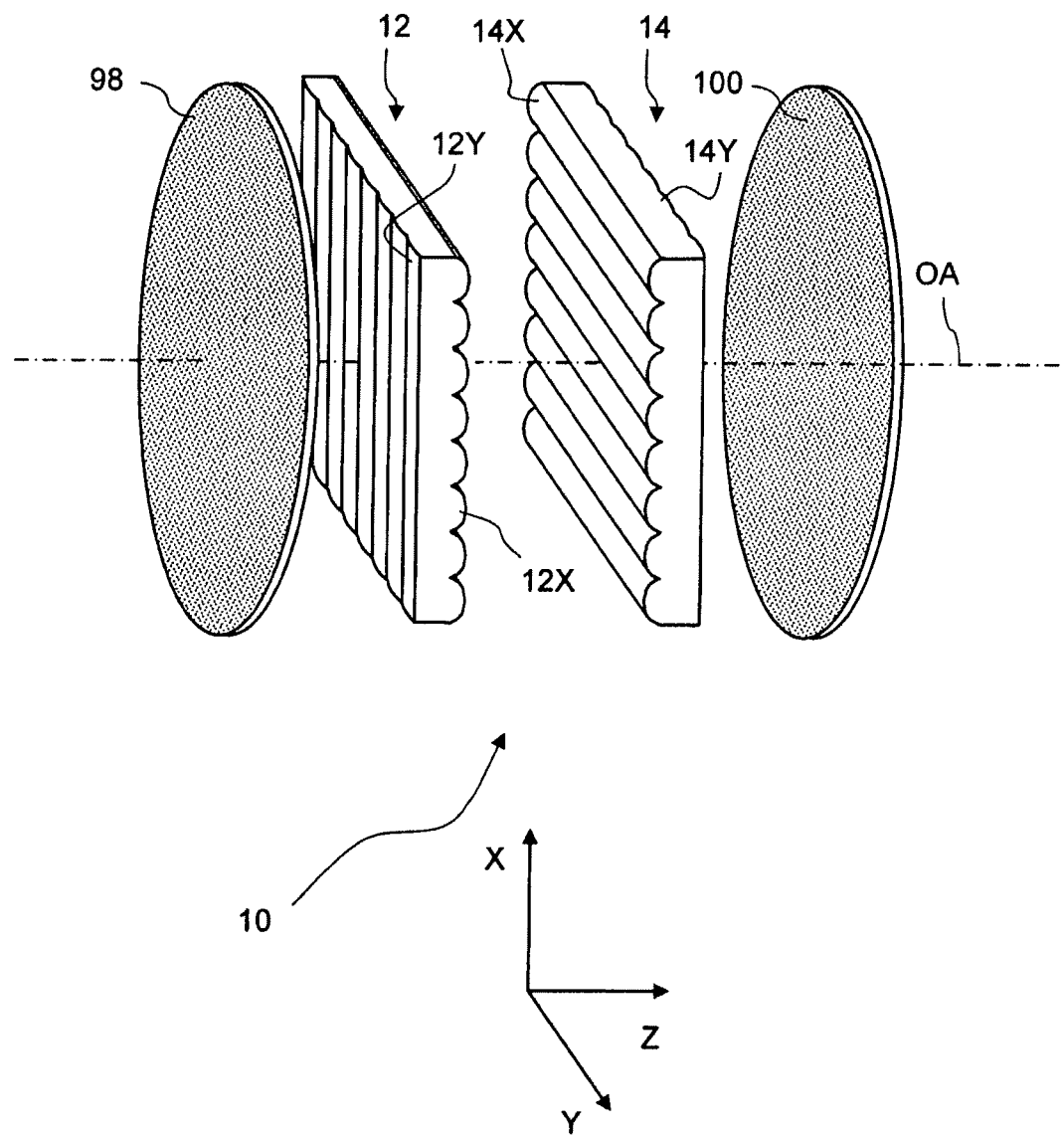
FIG. 31 is a perspective view of an optical arrangement including the optical integrator shown in FIG. 1 and two scattering plates.

FIG. 31 is a perspective view of the optical integrator 10 in a representation similar to FIG. 1. In this embodiment two scattering plates 98 and 100 are arranged in front of and behind the optical integrator 10, respectively. The scattering plates 98, 100 also contain arrays of microlenses that have varying geometries similar to the microlenses that have been described above.

The above description has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

The invention claimed is:

1. A method of manufacturing an array of elongated microlenses configured to be used in an illumination system of a microlithographic projection exposure apparatus, the method comprising:

a) repeatedly moving a cutting tool comprising a cutting edge relative to a substrate in a fly-cut process so that the cutting edge cuts into the substrate; and
b) moving the substrate during step a) along a longitudinal direction;
c) moving the substrate at least substantially perpendicular to the longitudinal direction; and
d) repeating a) and b) to provide the array of elongated microlenses,
wherein the method comprises rotating the cutting tool around a rotational axis, the cutting edge points away from the rotational axis, and the elongated microlenses have longitudinal axes which are parallel to the longitudinal direction.

2. The method of claim 1, comprising moving the substrate parallel to a machining plane.

3. The method of claim 1, comprising moving the substrate along straight parallel lines during b).

4. The method of claim 1, comprising moving the substrate along straight zig zag lines or serpentines during b).

5. The method of claim 1, wherein the rotational axis extends at least substantially parallel to a substrate surface on which the elongated microlenses are formed.

6. The method of claim 1, wherein the cutting edge is spaced apart from the rotational axis by at least 5 mm.

7. The method of claim 1, wherein the cutting edge is spaced apart from the rotational axis by more than 9 mm and less than 11 mm.

8. The method of claim 1, comprising rotating the cutting tool with a rotational frequency in excess of 5000 1/min.

9. The method of claim 1, comprising rotating the cutting tool with a rotational frequency between 8000 1/min and 10000 1/min.

10. The method of claim 1, wherein the cutting edge is concavely or convexly curved.

11. The method of claim 1, comprising, during c), moving the substrate substantially by a multiple of a pitch of the elongated microlenses.

12. The method of claim 1, comprising reworking a portion of the surface of an elongated microlens to change a surface profile of the elongated microlens.

13. The method of claim 12, wherein reworking the portion of the surface of the elongated microlens comprises repeating a) and b) with an additional cutting tool having a different cutting edge.

14. The method of claim 12, wherein reworking the portion of the surface of the elongated microlens comprises repeating a) and a) with the cutting tool turned around by 180°.

15. The method of claim 1, comprising polishing a portion of an elongated microlens.

16. The method of claim 1, comprising exposing a portion of an elongated microlens to an ion beam.

17. The method of claim 16, wherein all ions in the ion beam move at least substantially parallel to an ion beam direction.

18. The method of claim 16, comprising applying a cover layer on the portion of the elongated microlens prior to exposure to the ion beam.

19. The method of claim 16, wherein the ion beam has a cross section with a maximum dimension which is greater than a pitch of the elongated microlenses.

20. The method of claim 16, wherein the ion beam has a cross section with a maximum dimension which is greater than 5 times a pitch of the elongated microlenses.

21. The method of claim 16, wherein an orientation between the portion of the elongated microlens and the ion beam is changed to adjust for a change of a surface profile of the elongated microlens.

22. The method of claim 16, wherein the elongated microlenses extends parallel to a second direction, and the ion beam has a direction which is in a plane of incidence parallel to the second direction and perpendicular to a plane in which the elongated microlenses extend.

23. The method of claim 16, wherein the elongated microlenses extend parallel to a second direction, and the ion beam has a direction which is in a plane of incidence that is perpendicular to the second direction.

24. The method of claim 23, comprising exposing the elongated microlenses to another ion beam which has a direction in the plane of incidence but symmetrical to a surface normal of the substrate.

25. The method of claim 16, wherein only those portions of the elongated microlenses arranged in different areas of the array are reworked.

26. The method of claim 1, wherein the substrate:
is a $CaF_2$ crystal having a surface that is machined by the cutting tool, the surface of the $CaF_2$ crystal being at least substantially parallel to a {111} crystal plane, and
is oriented with respect to the moving cutting tool so that the cutting edge cuts into the substrate along an actual cutting direction which forms a deviation angle of less than 20° to an ideal cutting direction, the ideal cutting direction being perpendicular to one of the three {100} crystal planes, and the ideal cutting direction pointing toward a corner of a triangle formed by the intersection of the {111} crystal plane with the three {100} crystal planes.

27. The method of claim 26, wherein two arrays of parallel elongated microlenses are manufactured subsequently on opposite sides of the substrate, and the surface of the $CaF_2$ crystal is at least substantially parallel to a {111} crystal plane during the manufacture of both arrays.

28. The method of claim 27, wherein the deviation angle is between 13° and 17° for both arrays.

29. The method of claim 27, wherein the deviation angle equals substantially 15° for both arrays.

30. A method of reworking an array of elongated microlenses having a maximum pitch, the array of elongated microlenses being configured for use in an illumination system of a microlithographic projection exposure apparatus, the method comprising:
exposing a portion of an elongated microlens to an ion beam having a cross section with a maximum dimension greater than a maximum pitch of the portion of the elongated microlenses,
wherein an orientation between the portion of the elongated microlens and the ion beam is changed to adjust for a modification of a surface profile of the elongated microlens by the ion beam.

31. A method of manufacturing an array of elongated microlenses configured to be used in an illumination system of a microlithographic projection exposure apparatus, the method comprising:
a) repeatedly moving a cutting tool comprising a cutting edge relative to a substrate in a fly-cut process so that the cutting edge cuts into the substrate; and
b) moving the substrate during step a) along a longitudinal direction;
c) moving the substrate at least substantially perpendicular to the longitudinal direction; and
d) repeating a) and b) to provide the array of elongated microlenses,
wherein the method comprises rotating the cutting tool with a rotational frequency in excess of 5000 1/min, and the elongated microlenses have longitudinal axes which are parallel to the longitudinal direction.

32. The method of claim 31, wherein the method comprises rotating the cutting tool with a rotational frequency between 8000 1/min and 10000 1/min.

33. A method of manufacturing an array of elongated microlenses configured to be used in an illumination system of a microlithographic projection exposure apparatus, the method comprising:
a) repeatedly moving a cutting tool comprising a cutting edge relative to a substrate in a fly-cut process so that the cutting edge cuts into the substrate; and
b) moving the substrate during step a) along a longitudinal direction;
c) moving the substrate at least substantially perpendicular to the longitudinal direction; and
d) repeating a) and b) to provide the array of elongated microlenses,
wherein the method comprises reworking a portion of the surface of an elongated microlens to change a surface profile of the elongated microlens, and the elongated microlenses have longitudinal axes which are parallel to the longitudinal direction.

34. The method of claim 33, wherein reworking the portion of the surface of the elongated microlens comprises repeating a) and b) with an additional cutting tool having a different cutting edge.

35. The method of claim 33, wherein reworking the portion of the surface of the elongated microlens comprises repeating a) and a) with the cutting tool turned around by 180°.

36. A method of manufacturing an array of elongated microlenses configured to be used in an illumination system of a microlithographic projection exposure apparatus, the method comprising:
a) repeatedly moving a cutting tool comprising a cutting edge relative to a substrate in a fly-cut process so that the cutting edge cuts into the substrate; and
b) moving the substrate during step a) along a longitudinal direction;
c) moving the substrate at least substantially perpendicular to the longitudinal direction; and
d) repeating a) and b) to provide the array of elongated microlenses,
wherein the method comprises exposing a portion of an elongated microlens to an ion beam, and the elongated microlenses have longitudinal axes which are parallel to the longitudinal direction.

37. The method of claim 36, wherein all ions in the ion beam move at least substantially parallel to an ion beam direction.

38. The method of claim 36, comprising applying a cover layer on the portion of the elongated microlens prior to exposure to the ion beam.

39. The method of claim 36, wherein the ion beam has a cross section with a maximum dimension which is greater than a pitch of the elongated microlens.

40. The method of claim 36, wherein the ion beam has a cross section with a maximum dimension which is greater than 5 times a pitch of the elongated microlens.

41. The method of claim 36, wherein an orientation between the portion of the elongated microlens and the ion beam is changed to adjust for a change of a surface profile of the elongated microlens.

42. The method of claim 36, wherein the elongated microlenses extends parallel to a second direction, and the ion beam has a direction which is in a plane of incidence parallel to the second direction and perpendicular to a plane in which the elongated microlenses extend.

43. The method of claim 36, wherein the elongated microlenses extend parallel to a second direction, and the ion beam has a direction which is in a plane of incidence that is perpendicular to the second direction.

44. The method of claim 36, wherein only those portions of the elongated microlenses arranged in different areas of the array are reworked.

45. A method of manufacturing an array of elongated microlenses configured to be used in an illumination system of a microlithographic projection exposure apparatus, the method comprising:
   a) repeatedly moving a cutting tool comprising a cutting edge relative to a substrate in a fly-cut process so that the cutting edge cuts into the substrate; and
   b) moving the substrate during step a) along a longitudinal direction;
   c) moving the substrate at least substantially perpendicular to the longitudinal direction; and
   d) repeating a) and b) to provide the array of elongated microlenses, wherein:
   the substrate is a $CaF_2$ crystal having a surface that is machined by the cutting tool, the surface of the $CaF_2$ crystal being at least substantially parallel to a $\{11\bar{1}\}$ crystal plane, and
   the substrate is oriented with respect to the moving cutting tool so that the cutting edge cuts into the substrate along an actual cutting direction which forms a deviation angle of less than 20° to an ideal cutting direction, the ideal cutting direction being perpendicular to one of the three {100} crystal planes, and the ideal cutting direction pointing toward a corner of a triangle formed by the intersection of the {111} crystal plane with the three {100} crystal planes
   the elongated microlenses have longitudinal axes which are parallel to the longitudinal direction.

46. The method of claim 45, wherein two arrays of parallel elongated microlenses are manufactured subsequently on opposite sides of the substrate, and the surface of the $CaF_2$ crystal is at least substantially parallel to a {111} crystal plane during the manufacture of both arrays.

47. The method of claim 46, wherein the deviation angle is between 13° and 17° for both arrays.

48. The method of claim 46, wherein the deviation angle equals substantially 15° for both arrays.

* * * * *

UNITED STATES PATENT AND TRADEMARK OFFICE
CERTIFICATE OF CORRECTION

PATENT NO. : 8,520,307 B2
APPLICATION NO. : 12/973234
DATED : August 27, 2013
INVENTOR(S) : Oliver Wolf et al.

It is certified that error appears in the above-identified patent and that said Letters Patent is hereby corrected as shown below:

Title Page, Col. 1 (Inventors), line 3, delete "Bopfingen (DE);" and insert -- Schweiz (DE); --.

In the Specification:

Col. 4, line 67, delete "FIG. 1 using a fly-cut process;" and insert the same on Col. 4, line 66, after "shown in", as a continuation of the paragraph.

Col. 5, line 5, delete "CaF2" and insert -- $CaF_2$ --.

Col. 10, line 14, delete "re-fract" and insert -- refract --.

Col. 10, line 35, delete "magnetorheologig" and insert -- magnetorheological --.

Col. 11, line 20, delete "unisotropic" and insert -- anisotropic --.

Col. 13, line 32, delete "form" and insert -- from --.

Col. 13, line 46, delete "or" and insert -- of --.

Col. 13, line 54, delete "sys-tern" and insert -- system. --.

Col. 14, line 3, delete "magnetorheologig" and insert -- magnetorheological --.

Col. 17, line 13, delete "+$x_o$)," and insert -- +$x_0$), --.

Col. 17, line 63, delete "-$x_o$ and +$x_o$)." and insert -- $x_0$ and +$x_0$). --.

Signed and Sealed this
Twelfth Day of November, 2013

Teresa Stanek Rea
*Deputy Director of the United States Patent and Trademark Office*

CERTIFICATE OF CORRECTION (continued)
U.S. Pat. No. 8,520,307 B2

In the Claims:

Col. 22, line 51 (Approx.), In Claim 14, after "and" delete "a)" and insert -- b) --.

Col. 24, line 34, In Claim 35, after "and" delete "a)" and insert -- b) --.

Col. 26, line 12 (Approx.), In Claim 45, delete "{111 }" and insert -- {111} --.